United States Patent
Basol et al.

(10) Patent No.: US 10,790,203 B2
(45) Date of Patent: Sep. 29, 2020

(54) METHODS AND SYSTEMS FOR MATERIAL PROPERTY PROFILING OF THIN FILMS

(71) Applicant: Active Layer Parametrics, Inc., Scotts Valley, CA (US)

(72) Inventors: Bulent M. Basol, Manhattan Beach, CA (US); Abhijeet Joshi, Los Angeles, CA (US); Jalal Ashjaee, Cupertino, CA (US)

(73) Assignee: Active Layer Parametrics, Inc., Scotts Valley, CA (US)

( * ) Notice: Subject to any disclaimer, the term of this patent is extended or adjusted under 35 U.S.C. 154(b) by 0 days.

(21) Appl. No.: 16/095,930

(22) PCT Filed: Apr. 25, 2017

(86) PCT No.: PCT/US2017/029424
§ 371 (c)(1),
(2) Date: Oct. 23, 2018

(87) PCT Pub. No.: WO2017/189582
PCT Pub. Date: Nov. 2, 2017

(65) Prior Publication Data
US 2019/0148248 A1 May 16, 2019

Related U.S. Application Data

(60) Provisional application No. 62/458,490, filed on Feb. 13, 2017, provisional application No. 62/458,500, (Continued)

(51) Int. Cl.
*H01L 21/00* (2006.01)
*H01L 21/66* (2006.01)
(Continued)

(52) U.S. Cl.
CPC .......... *H01L 22/26* (2013.01); *G01R 31/2648* (2013.01); *G01R 31/2831* (2013.01);
(Continued)

(58) Field of Classification Search
CPC ............. G01R 31/2648; G01R 31/2831; H01J 37/3244; H01J 37/32963; H01L 22/12;
(Continued)

(56) References Cited

U.S. PATENT DOCUMENTS

| 3,554,891 A | 1/1971 | Duffy et al. |
| 3,660,250 A | 5/1972 | Duffy et al. |

(Continued)

FOREIGN PATENT DOCUMENTS

| CN | 103165724 A | 6/2013 |
| EP | 1 237 179 A1 | 9/2002 |

(Continued)

OTHER PUBLICATIONS

Bartels, A. et al. (May 9, 1995). "A procedure for temperature-dependent, differential van der Pauw measurements," American Institute of Physics, vol. 66, No. 8, located at: http://aip.scitation.org/toc/rsi/66/8/, six pages.

(Continued)

*Primary Examiner* — Richard A Booth
(74) *Attorney, Agent, or Firm* — Kubota & Basol LLP

(57) ABSTRACT

Methods, tools and systems for full characterization of thin and ultra-thin layers employed in advanced semiconductor device structures are disclosed.

18 Claims, 16 Drawing Sheets

Related U.S. Application Data filed on Feb. 13, 2017, provisional application No. 62/494,177, filed on Jul. 30, 2016, provisional application No. 62/391,426, filed on Apr. 29, 2016, provisional application No. 62/391,331, filed on Apr. 26, 2016.

(51) Int. Cl.

| | | |
|---|---|---|
| *G01R 31/26* | (2020.01) | |
| *G01R 31/28* | (2006.01) | |
| *H01J 37/32* | (2006.01) | |
| *H01L 21/3065* | (2006.01) | |
| *H01L 21/67* | (2006.01) | |

(52) U.S. Cl.
CPC .... *H01J 37/3244* (2013.01); *H01J 37/32963* (2013.01); *H01L 21/3065* (2013.01); *H01L 21/67069* (2013.01); *H01L 21/67253* (2013.01); *H01L 22/12* (2013.01); *H01L 22/14* (2013.01); *H01L 22/20* (2013.01); *H01J 37/321* (2013.01); *H01J 2237/24564* (2013.01); *H01J 2237/3341* (2013.01)

(58) Field of Classification Search
CPC ..... H01L 22/14; H01L 22/20; H01L 21/3065; H01L 21/67069
See application file for complete search history.

(56) References Cited

U.S. PATENT DOCUMENTS

| | | | |
|---|---|---|---|
| 4,190,488 | A | 2/1980 | Winters |
| 4,303,482 | A | 12/1981 | Buhne et al. |
| 5,150,042 | A | 9/1992 | Look et al. |
| 5,217,907 | A | 6/1993 | Bulucea et al. |
| 5,652,151 | A | 7/1997 | Asada |
| 6,087,189 | A | 7/2000 | Huang |
| 6,136,213 | A | 10/2000 | Shinozuka et al. |
| 6,290,864 | B1 | 9/2001 | Patel et al. |
| 6,409,876 | B1 | 6/2002 | McQuarrie et al. |
| 6,500,356 | B2 | 12/2002 | Goto et al. |
| 6,554,205 | B1 | 4/2003 | Shinozuka et al. |
| 6,649,528 | B2 | 11/2003 | Yanagisawa et al. |
| 6,736,987 | B1 | 5/2004 | Cho |
| 6,887,337 | B2 | 5/2005 | Lebouitz et al. |
| 6,908,566 | B2 | 6/2005 | Yanagisawa et al. |
| 7,041,224 | B2 | 5/2006 | Patel et al. |
| 7,094,355 | B2 | 8/2006 | Yanagisawa |
| 8,278,222 | B2 | 10/2012 | Wu et al. |
| 2002/0142599 | A1 | 10/2002 | McQuarrie et al. |
| 2003/0016032 | A1 | 1/2003 | Licini et al. |
| 2004/0063329 | A1 | 4/2004 | Yanagisawa et al. |
| 2004/0203177 | A1 | 10/2004 | Davis et al. |
| 2005/0052191 | A1 | 3/2005 | Prussin |
| 2005/0124085 | A1 | 6/2005 | Andoh et al. |
| 2016/0079075 | A1 | 3/2016 | Leseman et al. |

FOREIGN PATENT DOCUMENTS

| | | |
|---|---|---|
| GB | 2 281 402 B | 3/1997 |
| TW | 200512893 A | 4/2005 |
| TW | 201420201 A | 6/2014 |
| TW | 201535507 A | 9/2015 |

OTHER PUBLICATIONS

Butner, J. et al. (Nov. 12-18, 2007). The effect of temperature on the Etch rate and roughness of surfaces etched with $XEF_2$,.Proceedings of ASME International Mechanical Engineering Congress and Exposition, Vancouver, British Columbia, Canada, four pages.

Easter, C. et al. (Oct. 31-Nov. 6, 2008). "$XEF_2$ Etching of silicon for the release of micro-cantilever based sensors," 2008 ASME International Mechanical Engineering Congress and Exposition, Boston, Massachusetts, USA, five pages.

Galloni, R. et al. (Oct. 27, 1982). "Fully automatic apparatus for the determination of doping profiles in Si by electrical measurements and anodic stripping," AIP, Review of Scientific Instruments, American Institute of Physics, vol. 54, No. 3, Bologna, Italy, six pages.

Kanarik, K. J. et al. (Mar. 5, 2015). "Overview of atomic layer etching in the semiconductor Industry," American Vacuum Society, vol. 33, No. 2, located at: http://dx.doi.org/10.1116/1.4913379, 15 pages.

Keithley. (Aug. 1, 2012). "Performing van der Pauw Sheet Resistance Measurements Using the Keithley S530 Parametric Tester," Application Note Series, No. 3180, Keithley Instruments, Inc., four pages.

Klein, C et al. (May 1, 2000). "Characterization of in situ etched and molecular beam epitaxy regrown GaAs interfaces using capacitance-voltage measurements, far infrared spectroscopy, and magnetotransport measurements," Journal of vacuum science & technology, microelectronics processing and phenomena, American Vacuum Society, New York, NY, US, vol. 18, No. 3, pp. 1562-1565, XP012008243, ISSN: 0734-211X, DOI: 10.1116/1.591426, section II sample preparation; p. 1562-p. 1563.

Oehrlein, G. S., et al. (2015). "Atomic Layer Etching at the Tipping Point: An Overview," ECS Journal of Solid State Science and Technology, vol. 4, No. 6, 13 pages.

Office Action received for Taiwanese Patent Application No. 107105331, dated Sep. 10, 2019, 25 pages (10 pages of English Translation and 15 pages of Official Copy).

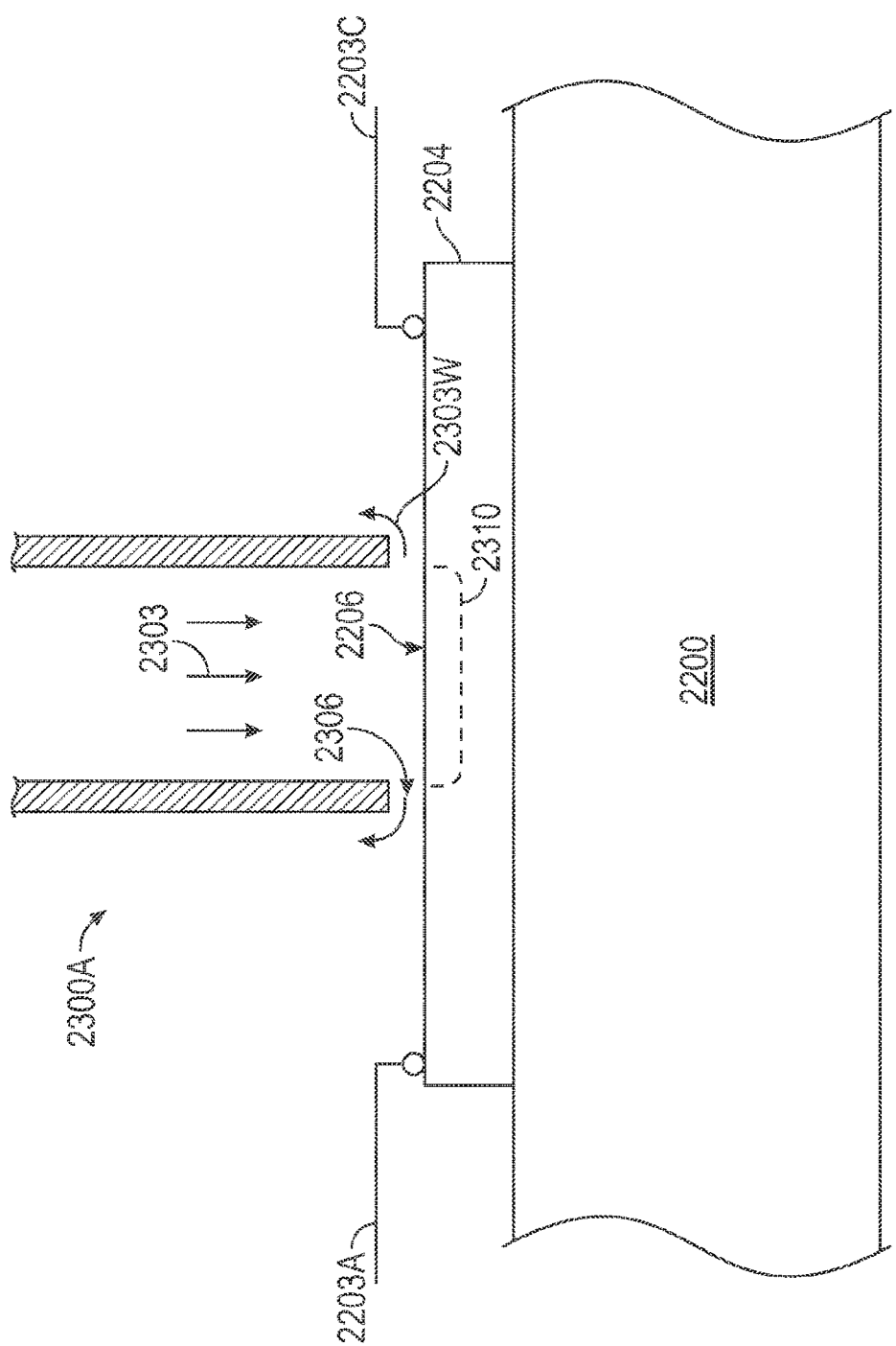

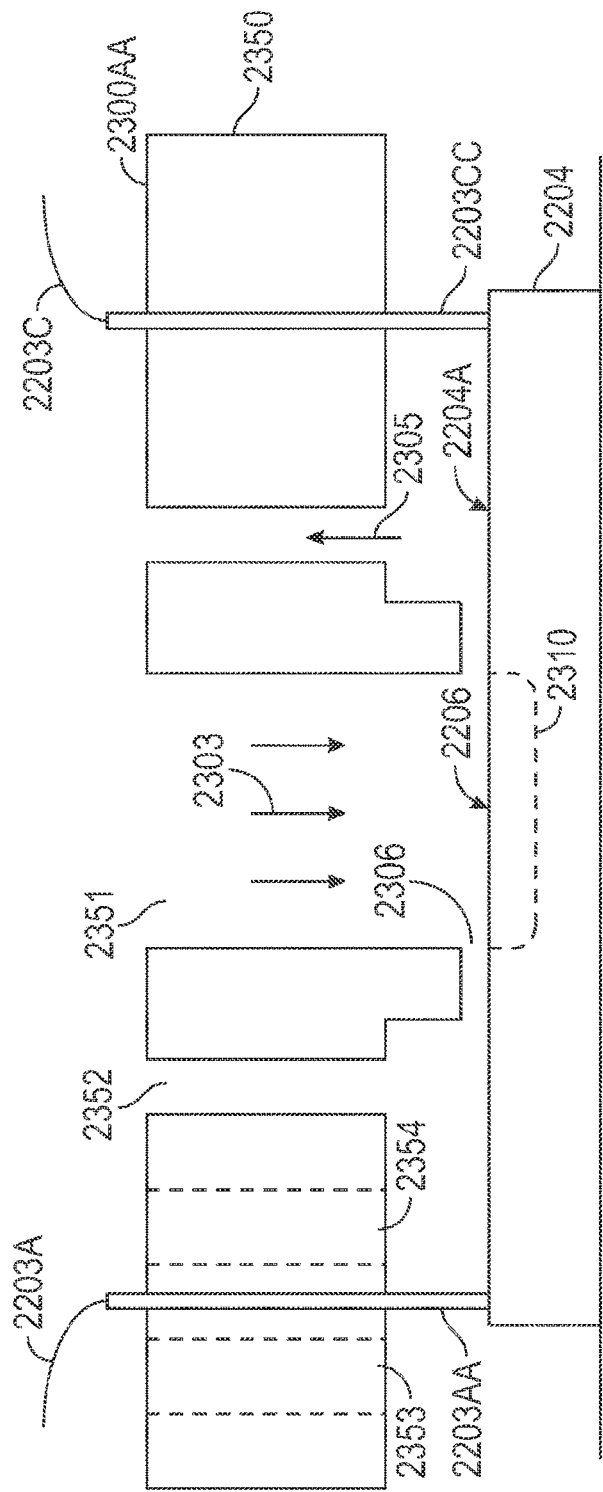

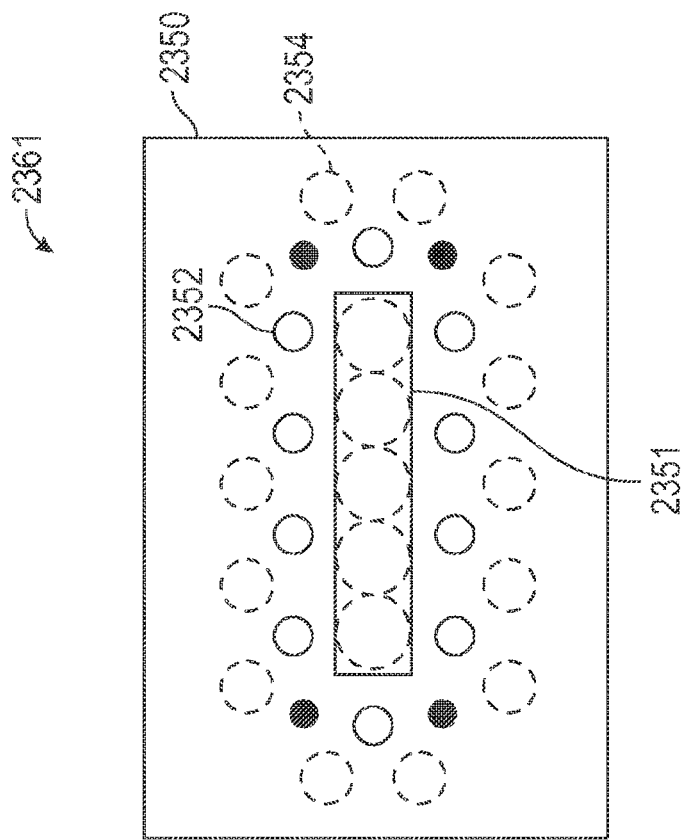
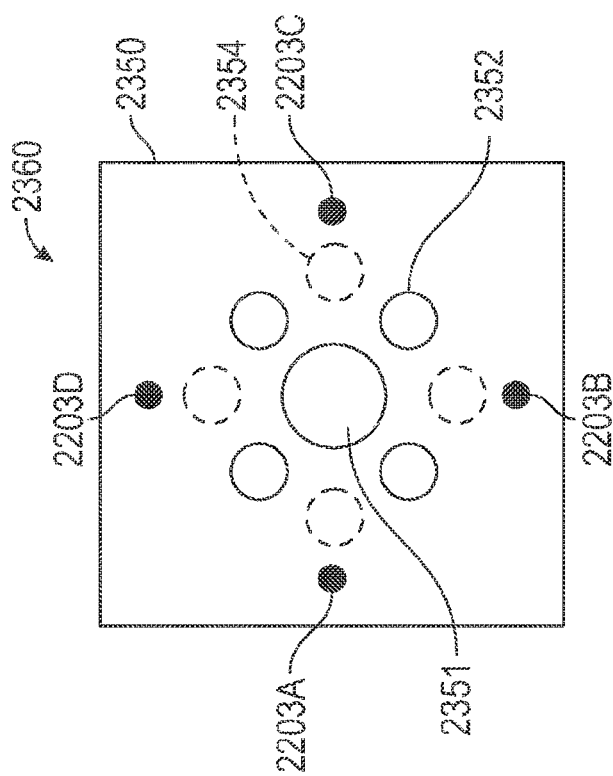
FIG. 6AAA

METHODS AND SYSTEMS FOR MATERIAL PROPERTY PROFILING OF THIN FILMS

CROSS REFERENCE TO RELATED APPLICATIONS

This application is a national stage application under 35 U.S.C. § 371 of International Application No. PCT/US2017/029424, filed internationally on Apr. 25, 2017, which claims priority benefit of U.S. Provisional Patent Application No. 62/458,490, filed Feb. 13, 2017, and U.S. Provisional Patent Application No. 62/458,500, filed Feb. 13, 2017, and U.S. Provisional Patent Application No. 62/494,177, filed Jul. 30, 2016, and U.S. Provisional Patent Application No. 62/391,426, filed Apr. 29, 2016, and U.S. Provisional Patent Application No. 62/391,331, filed Apr. 26, 2016. The contents of the above patent applications are incorporated by reference herein in their entirety for all purposes.

GOVERNMENT RIGHTS

This invention was made with Government support under 1632322 awarded by the National Science Foundation. The Government has certain rights to this invention.

FIELD OF THE INVENTION

The present invention is in the field of semiconductor film metrology methods and apparatus. More particularly, the present invention provides methods, tools and systems for full characterization of thin and ultra-thin layers employed in advanced semiconductor device structures.

BACKGROUND OF THE INVENTION

With the advancement of the semiconductor industry, electronic devices are getting more and more miniaturized and they employ doped thin and ultra-thin layers or ultra-shallow junctions and advanced high mobility semiconductor materials such as Ge, Si—Ge and III-V compounds in both planar and non-planar structures. To be able to develop and optimize such advanced devices, it is essential to measure the various material properties of the thin and ultra-thin layers within their structures, which may form for example the drain and source areas or channels of MOS-FETS including multi-gate structures. The thin and ultra-thin layers may be formed and doped through techniques such as epitaxial growth, ion implantation followed by rapid thermal or laser annealing, gas immersion laser doping, etc., and their thicknesses may be in the range of 2-50 nm. Some of the techniques that have been used to characterize semiconductor layers include Spreading Resistance Profiling (SRP), Scanning Spreading Resistance Microscopy (SSRM), Secondary Ion Mass Spectrometry (SIMS), and Electrochemical C-V profiling (ECV). SIMS provides the compositional information about the distribution of dopants through the thin layers, but it offers no electrical properties, which may be calculated based on some assumptions. SRP and SSRM provide resistivity of the film as a function of depth, and from this data carrier concentrations need to be calculated assuming mobility values. However, these techniques may not have the resolution to characterize the thinnest films used in advanced device structures. ECV gives a profile of charge concentration through the layer being measured, but it does not provide mobility values.

A wet technique for generating various depth profiles for thin semiconductor layers was disclosed in U.S. Pat. No. 7,078,919. In that approach, which is partially depicted in FIG. 1, a receptacle 100 that contains an electrolyte 101 is placed in contact with a top surface 102 of a semiconductor film 103 to be characterized. A seal 104 between the top surface 102 and the receptacle 100 keeps the electrolyte 101 contained over a test area 105. Electrical contact elements 110A and 110B placed outside the seal 104 allow electrical measurements. A potential difference may be applied between at least one of the electrical contact elements 110A and 110B and a cathode 106 dipped in the electrolyte 101 to anodically oxidize a top portion 103A of the semiconductor film 103 at the test area 105 converting the top portion 103A into an oxide. A measurement may then be carried out of the remaining bottom portion 103B of the semiconductor film 103. Using mathematical relationships, the electrical characteristics or properties of the material that was originally (before oxidation) at the top portion 103A of the semiconductor film 103 can then be calculated. It should be noted that some other depth profiling techniques utilized solution-based chemical etching methods instead of anodic oxidation approach (see for example U.S. Pat. Nos. 3,554,891, 3,660,250, and 4,303,482), wherein multiple wet solution-based chemical etching, drying, and measuring steps were employed.

There is a need to improve the material property profiling methods for ultra-thin semiconductor layers that are being developed for advanced node electronic device structures. As stated before these ultra-thin layers may have thicknesses smaller than 50 nm, and therefore profiling such layers may need a resolution of smaller than 1 nm so that a reasonable number of (such as 5-10) data points can be collected through a 2 nm thick layer. High surface roughness that may be left behind by the oxidation or solution-based chemical etching processes, as well as any non-uniform material removal by these techniques, may have negative consequences for the accuracy or dependability of the data collected.

Therefore, new methods and apparatus are needed with capability to accurately and reliably measure the characteristics of ultra-thin semiconductor layers, even at test areas that are smaller than about 1000 microns×1000 microns, preferably smaller than 100 microns×100 microns, and even when the semiconductor layers may be disposed over 3-dimensional structures.

BRIEF DESCRIPTION OF THE DRAWINGS

FIG. 6A is a sketch of another exemplary nozzle assembly without an exhaust channel.

FIG. 6AA shows a nozzle assembly with integrated contact elements.

FIG. 6AAA shows bottom views of two exemplary integrated nozzle assemblies.

FIG. 10CC shows a top view of an exemplary resist spacer.

DETAILED DESCRIPTION OF THE INVENTION

Present inventions provide methods and apparatus for measurement of material properties such as electrical properties of thin and ultra-thin material layers such as semiconductor layers to obtain material property depth profiles through their thicknesses at resolutions better than 0.5 nm. The semiconductor layer(s) may be disposed over a substrate such as a wafer. The electrical characteristics or properties may include properties such as sheet resistance, sheet conductance, resistance, magneto-resistance, conductance, resistivity, conductivity, mobility, and carrier concentration or active dopant concentration. Certain embodiments of the inventions provide methods and apparatus to obtain depth profiles of material properties without touching the surface of the semiconductor layer and without leaving any residues behind. Inventions may also be used for determining other material properties such as optical, electro-optical, physical (e.g. strain, stress) properties of any material layer and for the measurement of leakage currents in rectifying junctions. Techniques are applicable to measure material properties of all semiconductors including metal oxide semiconductors (such as polycrystalline or amorphous oxides comprising at least one of indium, tin, gallium, zinc, silver, and cadmium, which are used in fabricating thin film transistors for LCD displays), conductive oxides and transparent conductive oxides employed in the electronics industry.

Figure 1:
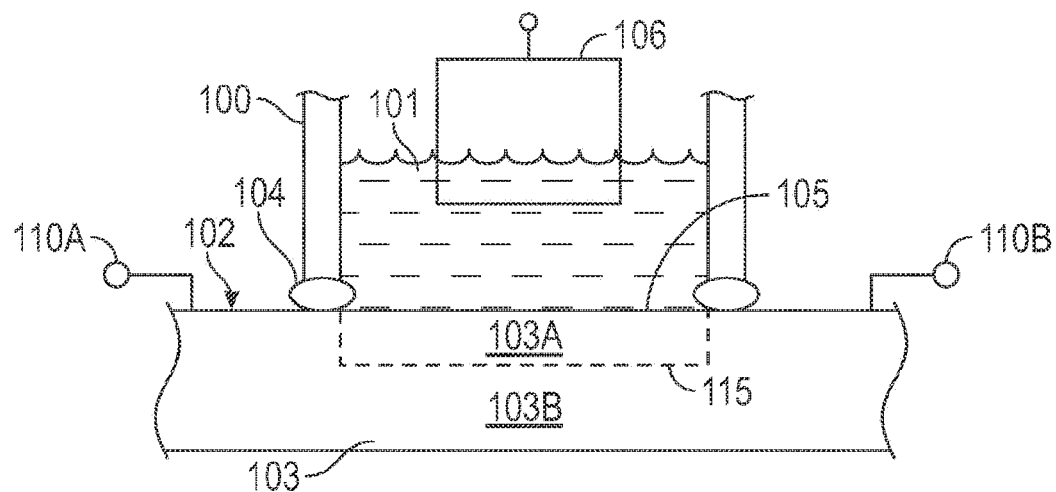
FIG. 1 is a sketch describing a wet anodic oxidation technique used to obtain electrical property profile of a thin semiconductor film.

FIG. 1 depicts an ideal situation wherein the top portion 103A of the semiconductor film 103 at the test area 105 is converted into an insulating oxide with excellent uniformity as shown by the dotted lines 115. In practice, however, there may be non-uniformities associated with such processes. It should be noted that if a solution-based chemical etching process were used, the top portion 103A would have been removed instead of oxidized.

Figure 2:
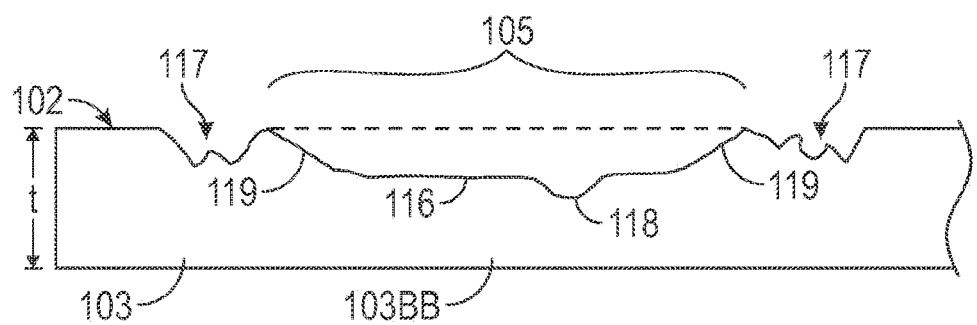
FIG. 2 is an exemplary semiconductor film partially chemically etched at a test area by a solution, the solution-based chemical etching process leaving behind various non-uniformities and damage under a seal.
Figure 2A:
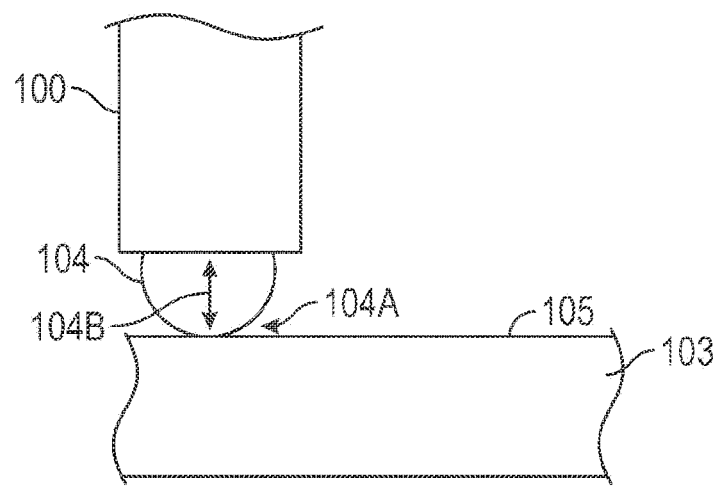
FIG. 2A is an expanded view of FIG. 1 near a seal.

FIG. 2 shows some of the practical non-uniformities that may result from the processes reviewed previously. The semiconductor film 103 in FIG. 2 may have been chemically etched by a solution at the test area 105 using an apparatus similar to the one shown in FIG. 1, leaving behind a cavity or trench 116 and a remaining portion 103BB of the semiconductor film 103. As can be seen from FIG. 2 the semiconductor film 103 may have been damaged at locations 117 by the seal 104 (see FIG. 1). Considering the fact that a thickness "t" of the semiconductor film 103 may be a few nanometers (such as in an ultra-shallow junction structure that may be <20 nm deep) and the seal 104 may have a thickness 104B (see FIG. 2A) in the range of 100,000-1,500,000 nm, pressing the seal 104 against the semiconductor film 103 may cause the damage at locations 117 shown in FIG. 2, especially if the force applied by the seal 104 onto the top surface 102 of the semiconductor film 103 is not properly controlled. The trench 116 in FIG. 2 may not be uniform (i.e. it may not be rectangular in shape). This may be due to the fact that the solution-based chemical etching process operating on the semiconductor film 103 at the test area 105 may not be able to remove materials next to the seal 104 as efficiently as it removes materials at locations away from the seal 104. This may be understood from FIG. 2A, which shows a close-up sketch of FIG. 1 near the seal 104. As can be seen in FIG. 2A, the relatively thick seal 104 forms a corner 104A over the semiconductor film 103, wherein the corner 104A may have a small angle section towards the interface where the seal 104 and the semiconductor film 103 meet. The corner 104A may be difficult to get into by any electrolyte or solution that may be used in the chemical etching or oxidation processes. It may also be difficult for any reaction products, resulting from a reaction between the semiconductor film 103 and the solutions employed, to get out of the corner 104A. Consequently, the non-uniformities, such as under-etched areas 119 of the trench 116 near the seal 104 may be formed. There may also be over-etched regions 118 away from the seal 104 caused by other process non-uniformities.

The exemplary non-uniformities shown in FIG. 2 may give rise to inaccuracies in data collected about the semiconductor film 103. This is because when an electrical property of the remaining portion 103BB of the semiconductor film 103 is measured after the solution-based chemical etching step, this measurement would include contributions from the under-etched areas 119 of the semiconductor film 103 next to the seal 104, and it would not include the contribution of the over-etched region 118. The damage at locations 117 would also introduce extra resistance to any current that may be passed through the semiconductor film 103 during the electrical measurements. It should be noted that as the test area 105 gets smaller and smaller, the error introduced into the electrical measurements by the non-uniformities shown in FIG. 2 may get larger and larger. In advanced semiconductor device manufacturing, materials characterization may have to be carried out within 50-100 micron wide scribe lines on product wafers. This means that the test area 105 may have to be miniaturized to that level, and errors due to the non-uniformities mentioned above may be very large. Also, during solution-based oxidation or etching processes, gas bubbles may form at the liquid/semiconductor surface interface, especially at sharp and low angle corners. Bubbles may reduce or completely retard chemical reactions and cause non-uniform etching or oxidation of the semiconductor film surface. It may also not be practical to have a liquid/semiconductor surface free of bubbles, reliably, within a highly-constrained sealed region with micron size dimensions.

Further, it may not be possible to carry out electrical measurements at a test area of a semiconductor film while keeping a wet or liquid chemical etchant or an anodic oxidation solution in physical contact with a top surface of the semiconductor film at the test area. If the resistance of the liquid chemical etchant or the anodic oxidation solution is comparable to or lower than the resistance of the semiconductor film at the test area, any electrical measurement made of the semiconductor film at the test area would be influenced by the finite resistance of the liquid chemical etchant or the anodic oxidation solution. The need to remove the liquid chemical etchant or the anodic oxidation solution after each etching or oxidation step may slow down the overall measurement throughput, may not allow continuous measurements, and may affect the process stability, especially for the measurement of ultra-thin semiconductor films. Furthermore, solution-based oxidation may not be used in a continuous or uninterrupted process, wherein electrical measurements may be continuously carried out as the anodic oxidation of the semiconductor film surface is performed. The reason is that anodic oxidation involves application of a voltage to the semiconductor layer, which may interfere with the electrical measurements, which also involve application of other voltages to the semiconductor layer. Also, ultra-thin layers may be on non-planar 3-dimensional complex structures such as fins and nano tubes, making the process of solution oxidation or solution etching much more challenging and non-uniform.

Thus, in a first embodiment of the disclosure, gaseous etchants can chemically remove portions of a semiconductor layer at a small test region forming a trench in a highly controllable manner without leaving behind any residues. In one example, the semiconductor layer to be characterized may be in the shape of a test pattern, which may be formed, prepared or fabricated before the measurements to be discussed are carried out. The semiconductor layer may be placed in a containment chamber. A process chamber with an open end, and comprising one or more inlets and outlets may also be provided in the containment chamber. During the process, the open end of the process chamber and a top surface of the semiconductor layer may be brought in physical contact, forming a confined process space such that a test region of the semiconductor layer is exposed to the confined process space. A gaseous etchant or process gas may then be introduced into the confined process space exposing the test region to the gaseous etchant. As the test region gets chemically etched and thinned forming a trench, the electrical properties of the remaining layer may be measured using electrical contacts made to the semiconductor layer outside the process chamber. Such measurement maybe carried out continuously or in a stepwise manner until etching may be terminated when a depth of the trench reaches a final value.

In another embodiment, a gas delivery nozzle may be brought to close proximity of a test region of the semiconductor layer without touching the top surface. The semiconductor layer may be in the shape of a test pattern. A gaseous etchant or process gas may be directed onto the test region. As the test region gets etched and thinned by the gaseous etchant forming a trench, the electrical properties of the remaining layer may be measured. Such measurement maybe carried out continuously or in a stepwise manner.

In yet another embodiment, a resist spacer may be formed over a top surface of a test pattern fabricated, prepared or formed from a semiconductor layer to be characterized. The resist spacer may comprise a window that may expose a test region of the test pattern, thereby closely defining an area of the test region. A process chamber may be lowered onto the resist spacer such that an open end of the process chamber may seal against a top side of the resist spacer forming a process cavity and exposing the test region to the process cavity. A liquid chemical etchant, a gaseous etchant or an anodic oxidation solution may then be introduced into the process cavity, and etching or oxidation process(es) may be performed at the test region. Electrical measurements may be carried out using electrical contacts made to the test pattern outside the process chamber either after the etching/oxidation step or simultaneously with the gaseous etching step. The resist spacer may protect the top surface of the test pattern from damage by a seal of the process chamber, and the window may define the test region accurately. Alternately, a gas delivery nozzle may be brought to close proximity of the test region defined by the window of the resist spacer without touching the top side of the resist spacer. A process gas or gaseous etchant may then be directed onto the test region by the gas delivery nozzle. As the test region gets etched and thinned by the gaseous etchant, the electrical properties of the remaining layer may be measured. Such measurement maybe carried out continuously, i.e. etching and measurements may be carried out simultaneously, or in a stepwise manner, wherein each measurement may be performed after each etching step. The resist spacer may define the test region accurately and it may protect the top surface of the test pattern allowing etching only at the test region.

Various aspects of the present inventions will now be described using drawings.

Figure 3:
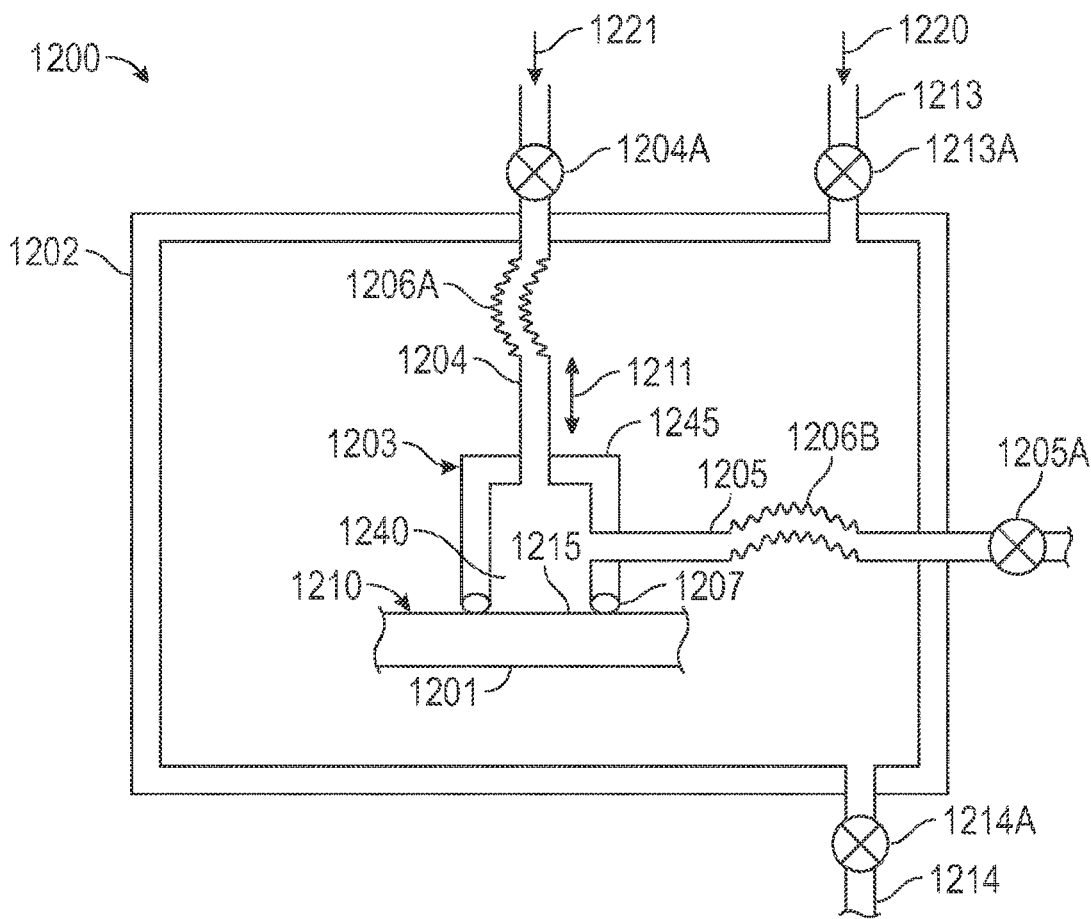
FIG. 3 is an exemplary apparatus that can be used to obtain a profile of the material properties of a thin semiconductor layer in accordance with an embodiment of the present inventions.

FIG. 3 shows an exemplary apparatus 1200 that may be used to electrically characterize an ultra-thin semiconductor layer 1201, which may be disposed over and supported by a substrate (not shown to simplify the drawing) such as a wafer commonly used in the semiconductor industry. In this embodiment, for exemplary purposes, a secondary containment or containment chamber 1202 may enclose the semiconductor layer 1201 and a process chamber 1203. The process chamber 1203 may have one or more inlets 1204 and one or more outlets 1205 which may be connected through flexible sections 1206A and 1206B so that an open end 1230 of the process chamber 1203 (see FIG. 3A) may be moved towards or away from a top surface 1210 of the semiconductor layer 1201 as shown by arrows 1211. Alternately, the process chamber 1203 may be stationary and the top surface 1210 may be moved towards or away from the process chamber 1203. There may also be a soft seal 1207 disposed over the circumference of the open end 1230 of the process chamber 1203 such that when the open end 1230 of the process chamber 1203 and the top surface 1210 of the semiconductor layer 1201 are brought in physical contact, the soft seal 1207 seals against the top surface 1210, forming a confined process space 1240 surrounded by one or more walls 1245 of the process chamber 1203, and exposing a test region 1215 of the semiconductor layer 1201 to the confined process space 1240. The one or more inlets 1204 and the one or more outlets 1205 may be equipped with inlet valves 1204A and outlet valves 1205A, to be able to control the flow of gaseous species such as a process gas into and out of the process chamber 1203, respectively. The containment chamber 1202 may have its own gas supply line 1213 with a supply line valve 1213A, and exhaust line 1214 with an exhaust line valve 1214A, to bring gases into the containment chamber 1202 and to take gases out of the containment chamber 1202, and also to create a vacuum in the containment chamber 1202, if needed. Alternately the containment chamber may comprise air at atmospheric pressure.

Figure 3A:
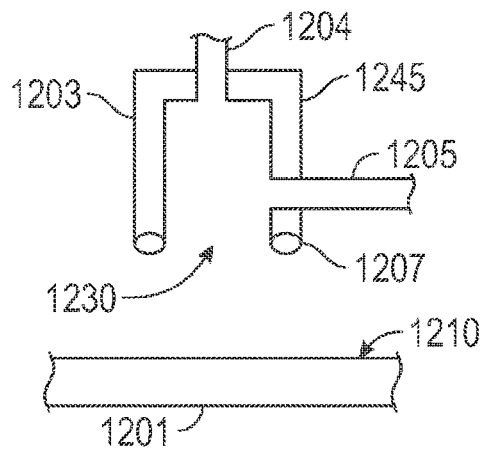
FIG. 3A is a sketch of a process chamber with its open end moved away from a top surface of a semiconductor layer to be characterized.
Figure 3B:
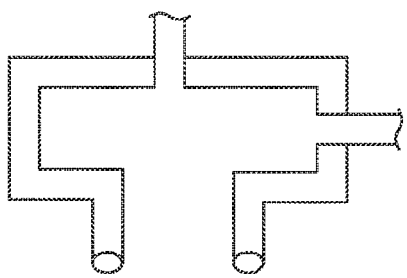
FIG. 3B is a sketch of another process chamber with a larger internal volume than the one shown in FIG. 3A.

The process chamber 1203 may have various different shapes. It is however, preferable that it is cylindrical with an internal diameter of smaller than 10 mm, preferably smaller than 5 mm and most preferably smaller than 2 mm. Preferably, an area of the test region 1215 may be substantially smaller than a total area of the top surface 1210 of the semiconductor layer 1201. It should be noted that the area of the test region 1215 may be substantially the same as a cross sectional area of the open end 1230 of the process chamber 1203. As an example, the total area of the top surface 1210 of the semiconductor layer 1201 may be in the range of 2-1000 $cm^2$ or larger, whereas the area of the test region 1215 may be smaller than 1% of the total area of the top surface 1210. The area of the test region 1215 may preferably be smaller than about 0.2 $cm^2$ and most preferably smaller than about 0.04 $cm^2$. Micro size o-ring seals with 0.1 mm internal diameter would allow to define a test region 1215 with an area of less than 0.0001 $cm^2$. The shape of the process chamber 1203 may be designed in such a way that the area of the test region 1215 may be kept small but the confined process space 1240 may be large to accommodate enough process gas to provide a desired amount of etching. FIG. 3B shows such an exemplary design of such a process chamber.

Process steps of the present invention may be carried out in various ways using the exemplary apparatus 1200 of FIG. 3. For example, in an exemplary process flow the inlet and outlet valves 1204A and 1205A as well as the supply line valve 1213A may be closed and the exhaust valve 1214A may be opened. The process chamber 1203 may be lifted up away from the top surface 1210 of the semiconductor layer 1201 as shown in FIG. 3A, and a vacuum may be generated in the containment chamber 1202 by pumping it down through the exhaust line 1214. After a base pressure, which may be less than about 30 mTorr, is reached, the exhaust line valve 1214A may be closed and the open end 1230 of the process chamber 1203 may be brought down onto the top surface 1210 so that the seal 1207 defines the test region 1215 over the top surface 1210. An electrical measurement may now be performed to measure the electrical properties of the semiconductor layer 1201 at the test region 1215. After getting the initial measurements, the gas supply line valve 1213A may be opened and a suitable gas 1220, such as an inert gas, may be introduced into the containment chamber 1202 through the gas supply line 1213 until a predetermined pressure level may be reached in the containment chamber 1202. In the meantime, the inlet valve 1204A may be opened and a process gas 1221 may be introduced into the confined process space 1240 of the process chamber 1203. The process gas 1221 may be delivered to the top surface 1210 of the semiconductor layer 1201 at the test region 1215 until a process pressure may be reached within the confined process space 1240. The inlet valve 1204A may then be closed. Alternately the inlet valve 1204A may be kept open and the process gas 1221 may continue to flow into the confined process space 1240. In this case it is preferable that the outlet valve 1205A also be open to keep the process pressure substantially constant in the confined process space 1240. A process vacuum pump (not shown) attached to the outlet 1205 after the outlet valve 1205A may be configured to regulate the process pressure in the confined process space 1240, as the process gas 1221 may continue to flow into the confined process space 1240 if a process pressure less than atmospheric pressure is desired. Although the process pressure within the confined process space 1240 and the predetermined pressure level in the containment chamber 1202 may be different, it is preferable that they be substantially the same, so that the semiconductor layer 1201 and its substrate may not be subjected to a stress due to a pressure differential between inside the process chamber 1203 and inside the containment chamber 1202.

In another exemplary process flow, the inlet and outlet valves 1204A and 1205A may be opened and the confined process space 1240 may be flushed with an inert gas coming through the inlet valve 1204A and leaving through the outlet valve 1205A. During this time, the suitable gas 1220 such as another inert gas may be flown into the containment chamber 1202 through the gas supply line valve 1213A and may be exhausted out through the exhaust line valve 1214A, thereby establishing atmospheric pressure in the containment chamber 1202. It is also possible to have ambient air in the containment chamber 1202 during this process. After flushing the process chamber 1203 with the inert gas coming through the inlet valve 1204A, the electrical measurement system may now be used to measure the electrical properties of the semiconductor layer 1201 at the test region 1215. After getting the initial measurements, the process gas 1221 may be introduced into the confined process space 1240 of the process chamber 1203. The process gas 1221 may be delivered to the top surface 1210 of the semiconductor layer 1201 at the test region 1215 and it may flow out through the outlet 1205. It should be noted that this may be an atmospheric pressure process wherein the process gas 1221 may be supplied by a source at over atmospheric pressure. The test region 1215 may be at the atmospheric pressure or up to about 25 Torr above the atmospheric pressure.

Once the process gas 1221 touches the top surface 1210 of the semiconductor layer 1201, it can start chemically reacting with the semiconductor species and can start etching the top surface 1210 at the test region 1215 forming volatile species and a trench. After a predetermined etching period, material removal from the test region 1215 may be terminated by removing the process gas 1221 along with the volatile gaseous species formed as a result of the etching process from the process chamber 1203 by pumping, or by flushing with an inert gas. The electrical properties of the now thinner remaining portion of the semiconductor layer under the trench at the test region 1215 may then be measured by an electrical measurement system. The thinning and measuring steps may be repeated to obtain a depth profile of the electrical properties through the thickness of the semiconductor layer 1201 until a depth of the trench into the semiconductor layer 1201 reaches a final value. It should be noted that for measuring ultra-shallow junctions used in drain/source regions of advanced transistors, the final value of the trench depth may be less than 50 nm, preferably less than 30 nm. Furthermore, the most important region to measure may be the top 5 nm thickness of the semiconductor layer. Therefore, the etching rates in the process may preferably be adjusted to less than 5 nm/second, more preferably less than 2 nm/second, most preferably less than 1 nm/second to collect high-resolution data.

In an alternate embodiment, electrical measurements may be carried out in a continuous or semi-continuous manner as the semiconductor layer 1201 may be getting etched or thinned by the process gas 1221 at the test region 1215. It should be noted that the electrical measurement system that carries out the electrical measurements after each etching step or during etching is not shown in FIG. 3 to simplify the drawing. Such electrical measurement systems may comprise electrical contact elements to establish or make electrical contacts to the top surface 1210 of the semiconductor layer 1201 for sheet resistance and Hall voltage measurements. It should be noted that Hall voltage measurements may be carried out by employing a magnet that may apply a magnetic field to the test region 1215 wherein the magnetic field may be substantially perpendicular to the top surface 1210. The magnetic field strength applied may be 2000 Gauss or higher. Other components of the electrical measurement systems may include current sources, voltmeters, electronic switches, control circuitry and computers.

The gaseous chemical etching process described above, as integrated with an electrical characterization method such as a sheet resistance measurement and a Hall voltage or Hall coefficient measurement, has many advantages over the methods employing solution based wet oxidation and etching techniques. First of all, the present techniques utilize clean and dry methods to remove portions of a semiconductor layer in a test area or test region in highly controllable manner. By controlling the process pressure, by controlling the concentration and the nature of the process gas (also called gaseous etchant or etchant gas), and/or by changing the temperature of the semiconductor layer and the etching period, one can accurately control the amount of material removed and achieve resolutions better than 0.5 nm for the etching process that removes small portions of the semiconductor layer at the test area at low rate, such as at a rate of less than 0.1 nm/second. It is also possible to control gaseous etching rate by providing light energy to the surface being etched. For example, a laser beam directed onto the semiconductor surface may accelerate etching in areas it hits. Gaseous etching of the present inventions may also provide highly uniform material removal from the test area 1215 leaving behind a surface with roughness less than about 0.1 nm. Therefore, the present techniques may successfully characterize ultra-thin layers with thicknesses less than about 5 nm. Etching and measurement steps may be carried out sequentially (etch+measure+etch+measure, etc.) or simultaneously (without removing the process gas from the surface) since the resistance of the gaseous species may be much higher than the resistance of the semiconductor layer getting etched at the test area 1215 so that the resistance of the process gas present over the test area 1215 does not influence the electrical measurements made on the semiconductor layer. In techniques where an electrolyte or anodic oxidation solution is left over the measurement area when measurements are carried out, there may be interference by the solution or the electrolyte as explained before. If the anodic oxidation step forms a highly insulating thick oxide layer over the semiconductor surface at the test area, this thick oxide layer may insulate or isolate the electrolyte from the portion of the semiconductor layer being measured. However, in high-resolution measurements where less than 0.5 nm of the semiconductor layer needs to be converted into oxide, the ultrathin oxide layer formed may not be able to electrically isolate the electrolyte over the ultrathin oxide layer from the portion of the semiconductor layer under it. For example, a 0.1-0.2 nm thick anodic oxide formed on a Si or SiGe layer may not have the stoichiometric insulating oxide composition of $SiO_2$, but it may have sub-oxides ($SiO_x$, where x<2) or even hydroxide species. Such sub-oxides and hydroxide species may have a much lower resistivity than the resistivity value one expects from a stoichiometric $SiO_2$ layer. Also, the 0.1-0.2 nm thick oxide layer may electrically breakdown during the measurements made on the semiconductor layer and electrically short the electrolyte to the semiconductor, causing erroneous results for the first few data points. Therefore, use of the process gas or the etchant gas that is electrically insulating make it possible to carry out continuous electrical measurements with the etchant gas present over the test region. Additionally, gaseous etching leaves behind a clean surface unlike the wet techniques that may require cleaning the semiconductor layers and substrates after a depth profile is obtained.

Although the preferred embodiments of the present inventions have been described using as an example gaseous chemical etching of the semiconductor layer, it is also possible to practice the present inventions using gaseous conversion processes. In this case, a thin surface portion of the semiconductor layer may be converted into a converted layer such as an oxide or a high resistivity material by gaseous species such as oxidizing agents and electrical measurements may be carried out as the converted layer thickness grows.

Figure 4:
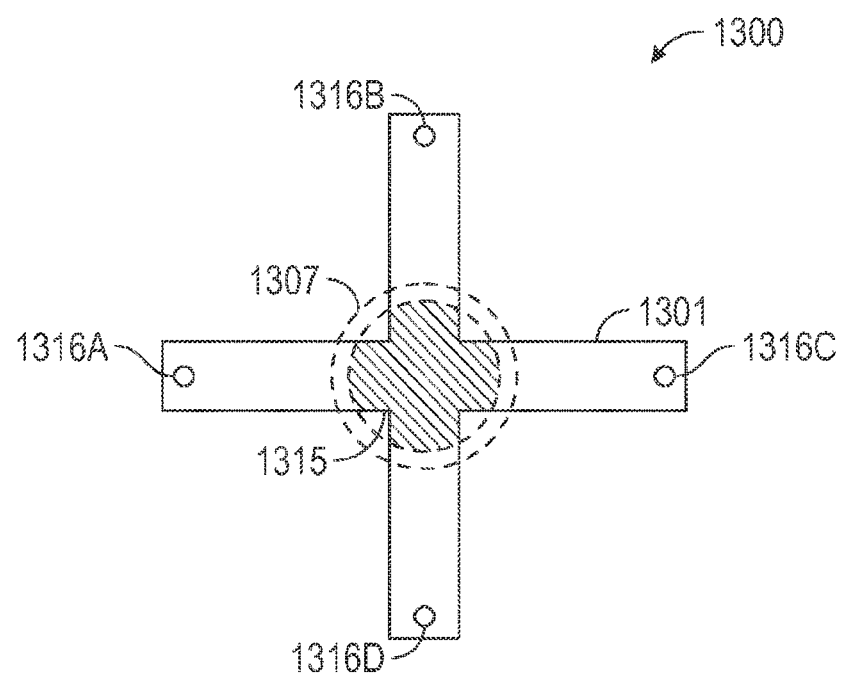
FIG. 4 is an exemplary Van Der Pauw pattern shaped semiconductor layer with electrical contacts disposed at four contact locations or regions.

FIG. 4 shows a top view 1300 of an exemplary semiconductor film 1301, which may be similar to the semiconductor layer 1201 of FIG. 3, and which may be characterized using the teachings of the present inventions. As can be seen from FIG. 4, the semiconductor film 1301 is in the form or shape of a material property measurement test pattern such as a cross Van der Pauw pattern. It should be noted that there are many Van Der Pauw patterns that can be used in place of the one shown in FIG. 4, including those in the form of bars, squares and cloverleaves (see for example Keithley Application Note Series Number 3180). The location of a process chamber seal 1307, which may be similar to the seal 1207 in FIG. 3, is shown as dotted lines in FIG. 4. The process chamber seal 1307 may define a measurement area 1315, which may be similar to the test region 1215 of FIG. 3. The measurement area 1315 is the hatched region shown in FIG. 4, and it is located within an area surrounded by the process chamber seal 1307. There may be electrical contact elements 1316A, 1316B, 1316C and 1316D making electrical contact at contact regions, which may be outside the measurement area 1315, such as at the ends of the test pattern or the Van Der Pauw pattern arms. These electrical contact elements may be used to make electrical measurements at the test region or the measurement area 1315 as the semiconductor material may be slowly thinned down by gaseous species of a process gas at the measurement area 1315 as described before. For example, sheet resistance values may be obtained as a function of semiconductor film thickness removed from the portion of the semiconductor film 1301 within the measurement area 1315 by applying a current between contact elements 1316A and 1316D through the semiconductor film 1301 and measuring the voltage drop between contact elements 1316B and 1316C. Mobility values may be obtained by applying a magnetic field perpendicular to the surface of the semiconductor film 1301, passing a current between contact elements 1316A and 1316C through the semiconductor film 1301 and measuring a Hall voltage between the contact elements 1316B and 1316D as the portion of the semiconductor film 1301 within the measurement area 1315 may be getting etched by the etchant gas in a step by step fashion or in a continuous fashion.

Referring back to FIG. 3, the process gas 1221 may comprise a reactive gas that has the ability to chemically etch the semiconductor layer 1201 forming volatile species that may be easily removed from the process chamber 1203 leaving behind a clean surface. Such reactive gases include but are not limited to gases comprising a halogen such as Cl, Br, I and F. Examples of the process gas include $XeF_2$, $Cl_2$, $F_2$, HCl vapor, HF vapor, $SF_6$, $CF_4$, $BCl_3$, and $Cl(F)_x$, $Br(F)_x$, $I(F)_x$ for various "x". The process gas may also comprise water vapor and $O_2$. The process gas may preferably comprise $XeF_2$.

The process pressure may be in the range of $10^{-4}$-760 Torr or higher. Process may be carried out at a temperature range of 20-100° C. The etching period may be in the range of seconds to minutes depending on the thickness of the material to be removed or whether or not the electrical measurements are made after each consecutive etching step or during a continuous etching period. In a process utilizing stepwise removal of material, the preferred etching period per etching step may be in the range of 1-20 seconds to remove a thickness of about 0.1-1 nm thick material.

So far, the discussion above has been based on chemical etching of a semiconductor layer surface at a predetermined test region using gaseous species. This method is the most preferred embodiment of the present inventions because chemical etching is mild and it does not damage the semiconductor surface during the etching process. Chemical gaseous etching may also leave behind a compositionally uniform surface that does not negatively impact the electrical measurements of the semiconductor layer.

Figure 3C:
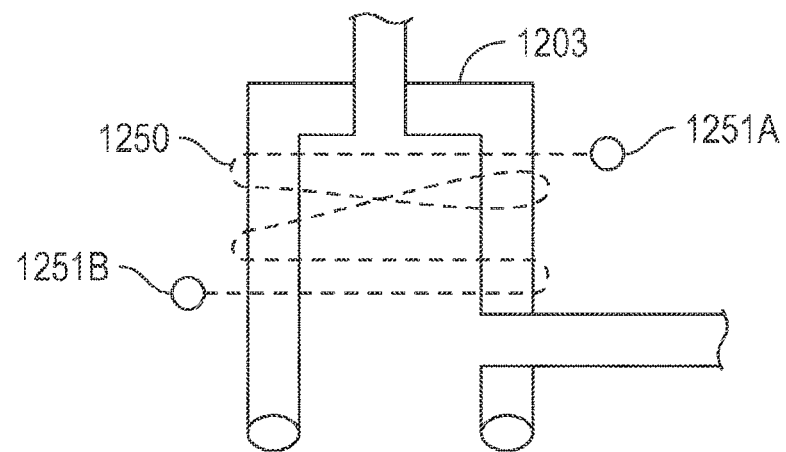
FIG. 3C is a sketch of a process chamber with the ability to generate inductively coupled plasma to activate a process gas during an etching process.

In another preferred embodiment of the present inventions, a plasma (e.g., a mild plasma) may be generated within the process chamber 1203 during an etching step to activate the gaseous species and increase the etch rate of the semiconductor layer. The plasma may be generated using any one of the well-known methods including but not limited to DC parallel plate, RF parallel plate, inductive coupling and microwave plasma generation. FIG. 3C shows an exemplary process chamber 1203 which is similar to the process chamber of FIG. 3A except that the process chamber 1203 of FIG. 3C may be constructed using an insulating material such as ceramic, glass or quartz and it comprises a conductive coil 1250 around its body to generate an inductively coupled plasma inside when a high frequency electric power is applied between the two terminals 1251A and 1251B of the coil 1250.

In yet another preferred embodiment of the present inventions, an atomic layer etching (ALE) type of a process may be used to thin down the semiconductor layer (see for example Oehrlein et al, "Atomic layer etching at tipping point: an overview," ECS Journal of Solid-State Science and Technology, vol:4, N5041-5053 (2015), and Kanarik et al. "Overview of ALE in semiconductor industry," Journal of Vacuum Science Technology A, vol:33, page:020802-1 (2015)) before each measurement step. Referring back to FIG. 3, in this case the process gas 1221 may comprise a precursor (such as a gas comprising any one of Cl, F, $O_2$, $H_2$), which may be delivered into the confined process space 1240. The precursor may react with the top surface 1210 of the semiconductor layer 1201 at the test region 1215 forming a monolayer of adsorbed reaction products. After the precursor is removed from the confined process space 1240, secondary species may be introduced into the confined process space 1240 to remove the monolayer of adsorbed reaction products causing removal of an atomic layer portion of the semiconductor layer 1201 at the test region 1215. Then electrical measurements may be carried out on the remaining semiconductor layer as described before. By repeating the ALE and electrical measurement steps, a very accurate depth profile of electrical parameters may be obtained for the semiconductor layer 1201. The secondary species may comprise but are not limited to low energy ions, fast neutral atoms, electrons and photons.

In another preferred embodiment of the present inventions, the thinning or thinning down of a material layer at a test region may be achieved using a voltage-induced wet dissolution process. It should be noted that in a solution-based chemical etching process, the material surface at the test region may be exposed to a chemical etchant solution, which chemically etches the material. To stop etching in this case, the chemical etchant solution needs to be removed from the surface of the material. In the case of solution-based oxidation process, which was described in reference to FIG. 1, the material layer surface at the test region may be exposed to an anodic oxidation solution or electrolyte and an anodic voltage may be applied to the material layer with respect to a cathode placed into the oxidation electrolyte. This process converts the surface of the material layer at the test region into an oxide without removing any material (i.e. the anodic oxidation solution does not have the capability to chemically dissolve the formed oxide). In a voltage-induced wet dissolution process of the present invention, the surface of the material layer at the test region may be exposed to a process solution, wherein the process solution may have the capability of thinning down the material layer at the test region only when a voltage is applied to the material layer with respect to an electrode placed into the process solution. Unlike the solution-based oxidation process, which does not thin down the material with or without voltage applied, and unlike the solution-based chemical etching process, which thins the material down by chemical etching without any voltage applied, the process solution of the voltage-induced wet dissolution process does not chemically dissolve or etch the material layer in absence of a voltage, but it thins the material layer down when the voltage is applied. Therefore, to stop the etching or thinning down process, it is not necessary to remove the process solution from the surface of the material layer at the test region—it is just necessary to remove the applied voltage. The voltage applied may be an anodic voltage or a cathodic voltage depending on the material layer and the process solution. The process solution may be selected so that it does not chemically attack and etch the surface of the material layer in the absence of a voltage but it is configured to etch the surface of the material layer when a voltage is applied to the material layer. For example, a Ge (germanium) layer may be controllably etched and thinned down using the voltage-induced wet dissolution process employing an exemplary process solution comprising mostly water (>99% by weight) and a small amount of ionic species such as chlorides, fluorides, iodides or nitrides. If a test region of the Ge layer is exposed to this exemplary process solution, no material is removed from the test region. When, however, an anodic voltage is applied to the Ge layer for an etching period, the test region of the Ge layer exposed to the process solution may be thinned down. A mechanism of this thinning down process may be: i) oxidation of the Ge layer surface at the test region by the applied voltage, followed by ii) dissolution of the surface oxide by the process solution. The amount of thinning can be controlled very accurately by counting the electrical charge passed through the test region during the etching period. It should be noted that this process is more attractive than the solution-based chemical etching techniques that employ strong chemical solutions with low resistivity. The weak solutions employed in voltage-induced wet dissolution processes are safer to handle and use; and they have very high resistivity, and therefore may be left over the test region during any electrical measurement made at the test region. Removed material layer thickness control may also be very accurate since the charge passed during the etching period can be very accurately measured and controlled.

In the methods described above, a seal, such as an elastic O-ring placed at the circumference of an open end of a process chamber, may make physical contact to a top surface of a semiconductor layer to be characterized. Although this may be acceptable in a development environment making measurements on blanket wafers, in applications such as patterned wafer manufacturing, touching the surface of a product wafer during a process step may require stringent cleaning procedures after the process step is completed if the wafer is to be returned back to the process flow. This adds cost to the overall process flow and the wafer may have to be discarded. Therefore, it may be preferred that characterization be carried out without touching the surface of the wafer with elastic materials that may introduce particles. The material removal technique utilized to thin down the semiconductor layer at the test region may also not leave residues that may be incompatible with the subsequent process steps, which may involve sensitive high temperature processes. If these conditions are met, then a product wafer may be characterized and returned back to the production flow to be further processed to complete the electronic devices on it. The following preferred embodiments of the present inventions describe non-contact delivery of process gasses or gaseous etchants to the top surface of the semiconductor layer in a non-contact manner.

Figure 5A:
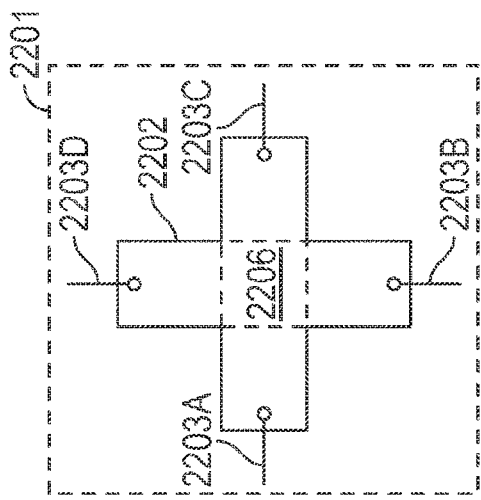
FIG. 5A shows an expanded view of the measurement zone in FIG. 5, wherein the measurement zone comprises an exemplary test pattern.
Figure 5B:
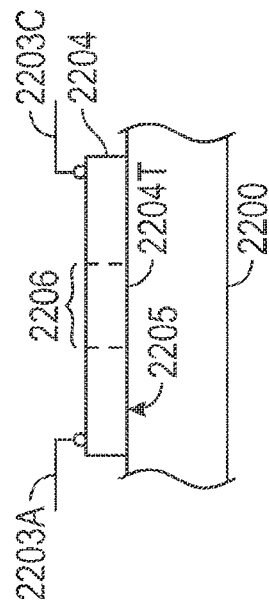
FIG. 5B is a cross sectional view of the exemplary test pattern of FIG. 5A.
Figure 5:
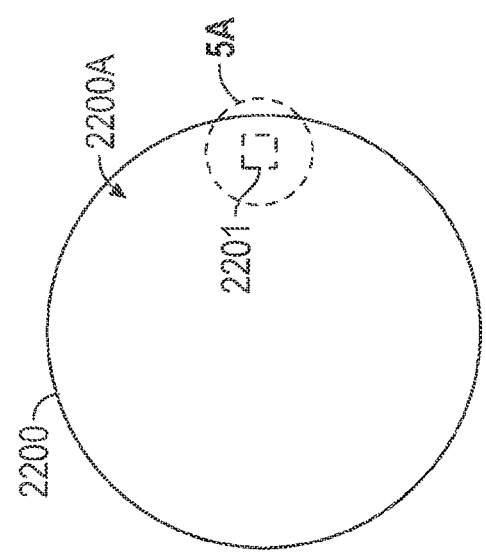
FIG. 5 shows a measurement zone on a substrate, which can be a wafer.
Figure 6:
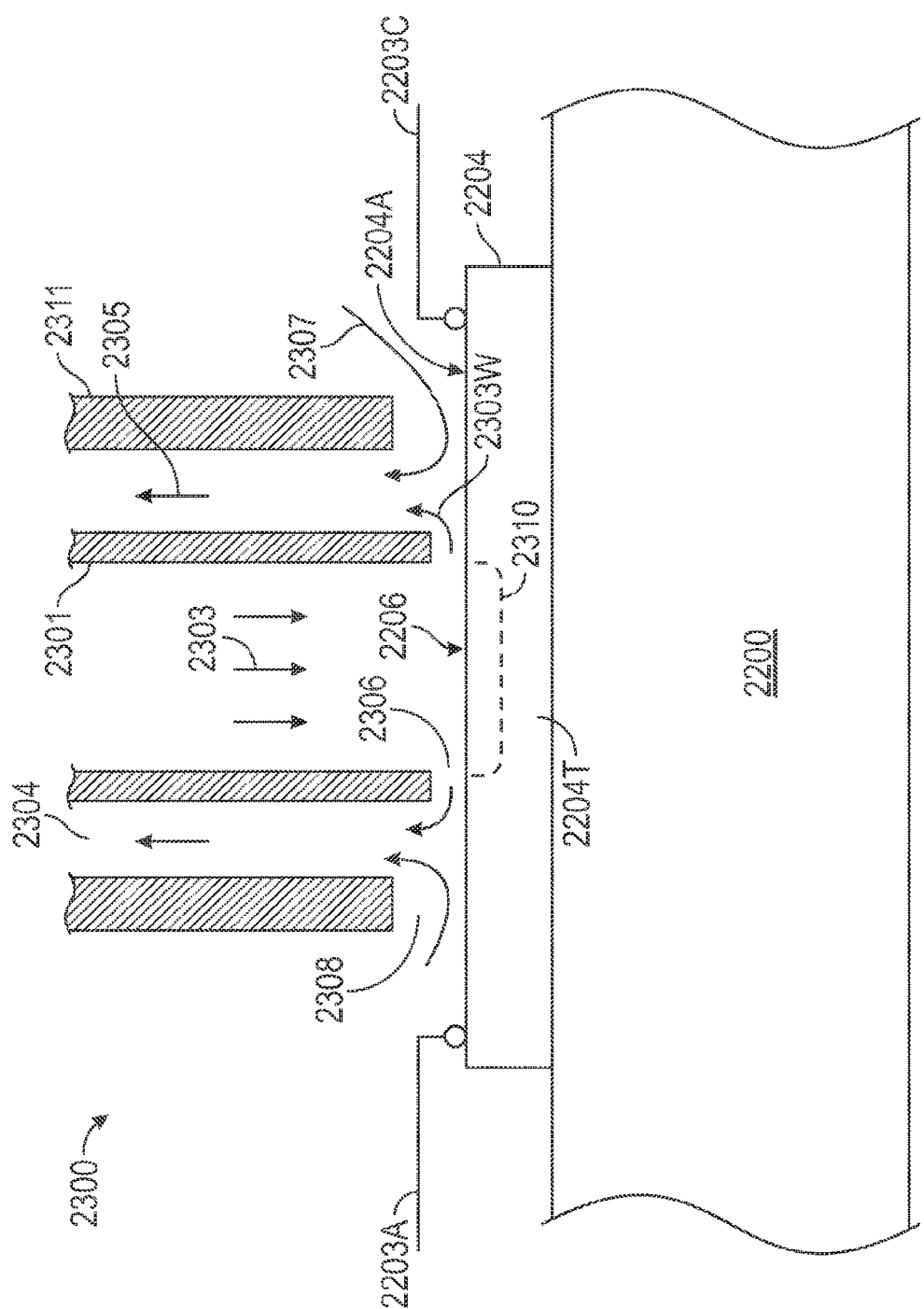
FIG. 6 is a sketch of an exemplary nozzle assembly configured to etch a layer portion of a semiconductor layer at a test region in a non-contact manner so that measurements may be carried out on the layer portion as its thickness is reduced.

FIG. 5 shows a substrate or a wafer 2200 comprising a measurement zone 2201 indicated by dotted lines. The wafer 2200 may be a blanket wafer with a semiconductor layer to be characterized disposed over its top surface 2200A. Alternately, the wafer 2200 may be a patterned wafer with partially finished devices (not shown) and with the semiconductor layer to be characterized having been disposed at the measurement zone 2201, which may be located within a scribe line. It should be noted that the typical width of a scribe line may be around 50 micrometers. An area of the measurement zone 2201 may be substantially smaller than a total area of the wafer 2200. For example, the measurement zone 2201 may be smaller than 10mm×10 mm, preferably smaller than 5mm×5 mm, most preferably smaller than 3mm×3 mm, whereas the total area of the wafer 2200 may be larger than 300 cm$^2$. Therefore, the area of the measurement zone 2201 may be less than 0.3% of the total area of the wafer 2200. For patterned wafers the measurement zone area may be smaller than 0.0001 cm$^2$. For example, for a 300 mm diameter wafer the measurement zone area may be less than 0.00002% of the total area of the wafer. Although the boundary of the measurement zone 2201 is shown as a square in FIG. 5, this boundary may be any shape. The measurement zone 2201 may comprise a test pattern (see for example FIG. 4) fabricated or prepared from the semiconductor layer by electrically isolating a small section of the semiconductor layer from its surroundings. Such isolation may be achieved through etching, scribing, laser ablation, etc. around the perimeter of the test pattern. As explained before, there are many different shapes and forms of test patterns that may be employed (such as bars, crosses, circles, squares, etc.). FIG. 5A shows an expanded view of the measurement zone 2201 of FIG. 5, and an exemplary test pattern 2202, which is in the form of a cross. Four electrical contact elements 2203A, 2203B, 2203C and 2203D are provided at the ends of the four arms of the test pattern 2202 outside a test region 2206. A cross-sectional view of the test pattern 2202, slicing through the contacts 2203A and 2203C, is shown in FIG. 5B. In this cross sectional view, one can see the semiconductor layer 2204 to be measured or characterized disposed over the wafer 2200. An interface 2205 at a bottom surface of the semiconductor layer 2204 may have electrical insulating properties so that the semiconductor layer 2204 may substantially be electrically isolated from the wafer 2200 by a high resistivity material or by a reverse biased rectifying junction. The test region 2206 of the test pattern 2202 is also shown in FIGS. 5A and 5B by dashed lines. A portion of the semiconductor layer 2204 at the test region 2206 is labeled as a test layer portion 2204T. The test region 2206 may be smaller than 3×3 mm$^2$, preferably smaller than 2×2 mm$^2$. Material removal and electrical measurements may be carried out in accordance with the present inventions at the test region 2206 on the test layer portion 2204T, as will be described next. FIG. 6 shows a nozzle assembly 2300 comprising a gas nozzle 2301 and an exhaust channel 2304. The nozzle assembly 2300 may be brought to close proximity of a top surface 2204A of the semiconductor layer 2204 (such as the one shown in FIG. 5B) establishing a first gap 2306 between the gas nozzle 2301 and the top surface 2204A of the semiconductor layer 2204. The gas nozzle is configured to direct a process gas, or a gaseous etchant or an etchant gas 2303 onto the layer portion 2204T (see FIG. 5B also) at the test region 2206. The wafer 2200 and the nozzle assembly 2300 may be movable with respect to each other and both may be housed in a containment chamber or an enclosure 2401 (see FIG. 7). The enclosure 2401 may comprise a barrier gas 2307, which may preferably be an inert gas like nitrogen. The etchant gas 2303 may be directed or flown towards the test region 2206 through the gas nozzle 2301 to start chemically thinning the test layer portion 2204T therein as shown by a dotted line 2310. Electrical contact elements 2203A, 2203B, 2203C and 2203D (see FIG. 5A also) may be used to measure a desired electrical parameter (such as resistivity or mobility) of the test layer portion 2204T as it gets thinned down in a clean and non-contact manner by the etchant gas 2303. From a series of measurements taken as a function of the thickness removed, a depth profile of the electrical properties may be calculated for the test layer portion 2204T, which may be a good representation of the semiconductor layer 2204. It should be noted that during the thinning process a waste gas 2303W may be produced over the test layer portion 2204T. The waste gas 2303W may comprise an unreacted portion of the etchant gas 2303 as well as any gaseous reaction products that may form over the test layer portion 2204T during etching. As shown in FIG. 6, the exhaust channel 2304 may be configured to collect the waste gas 2303W formed at the test region 2206, through the first gap 2306. The exhaust channel 2304 may also collect the barrier gas 2307 that may be flown through a second gap 2308 established between an outer wall 2311 of the exhaust channel 2304 and the top surface of the semiconductor layer 2204. This way, entry into the enclosure 2401 by the waste gas 2303W may be prevented.

It should be noted that electrical contact elements may preferably be integrated to a body of a nozzle assembly such as the integrated nozzle assembly 2300AA of FIG. 6AA. It should be noted that electrical contact elements may also be attached to the nozzle assembly 2300 of FIG. 6, preferably onto the outer wall 2311. The integrated nozzle assembly 2300AA may comprise a nozzle assembly block 2350. The nozzle assembly block 2350 may comprise at least one integrated gas inlet channel 2351 and at least one integrated gas exhaust channel 2352. There may be additional integrated channels 2353 and 2354 on either side of the contact 2203A and 2203C (not shown to simplify the drawing) as shown by dotted lines. The additional integrated channels 2353 and 2354 may serve as barrier gas inlet channels bringing a barrier gas towards the top surface 2204A of the semiconductor layer 2204 as described below in reference to FIG. 6B or they can be interchanged with at least one integrated gas exhaust channel 2352. Such barrier gas may protect the tips 2203AA and 2203CC of the electrical contact elements 2203A and 2203C from any corrosive effects of the etchant gas 2303. The electrical contact elements 2203A and 2203C may be attached to the nozzle assembly block 2350 such that when the first gap 2306 between the nozzle assembly block 2350 and the top surface 2204A of the semiconductor layer 2204 is established, the tips 2203AA and 2203CC of the electrical contact elements 2203A and 2203C (please note other contact elements are not shown in this cross section) may touch the semiconductor layer 2204 or the test pattern 2202.

The integrated nozzle assembly of FIG. 6AA may be fabricated in different shapes and forms. FIG. 6AAA shows bottom views of two exemplary integrated nozzle assemblies. The assembly 2360 may comprise a gas inlet channel 2351, and one or more (e.g., four) integrated gas exhaust channels 2352 fabricated into the nozzle assembly block 2350. Optional additional integrated channels 2354 that may serve as barrier gas inlet channels are also shown along with the electrical contact elements 2203A, 2203B, 2203C and 2203D. The assembly 2361 is designed to process a more rectangular area and the gas inlet channel 2351 is rectangular or a series of circular openings as shown by dotted lines in the rectangle. Electrical contact element placement in this design is near the corners of the rectangle defining the gas inlet channel 2351. It should be appreciated that a collection of integrated gas exhaust channels 2352 represents a distributed exhaust channel placed around the gas inlet channel 2351. Similarly, the gas inlet channel 2351 may also be a distributed inlet channel as shown for the assembly 2361. The distributed exhaust channels may comprise two or more individual channels and they may be placed around the gas inlet channel at various distances and orientations. There may be optional additional integrated channels 2354 that may serve as barrier gas inlet channels of the assembly 2361.

It should be noted that the present inventions apply a gaseous etching process to a pre-selected (e.g., small) region of a wafer in a highly-controlled fashion to thin down the material therein as measurements are made continuously or in a stepwise manner on the thinned down material. Unlike the applications where high etch rates (such as >10 nm/second) are desired, the present inventions use approaches that have the ability to provide very low etch rates (such as <1 nm/second) in a highly-controlled manner. It should be noted that the resolution of the present process (i.e. ability to obtain many data points for each thickness unit removed from the test layer portion 2204T shown in FIG. 5B) depends on the fine control of the low etch rate of the semiconductor material by the etchant gas. In a preferred embodiment of the present inventions the wafer is in an enclosure at atmospheric or near (for example up to 25 Torrs over) atmospheric pressure. In a more preferred embodiment, substantially the whole substrate or wafer stays in an enclosure with an environment of air or ambient air during the measurement.

The first gap 2306 in FIG. 6 may be less than 2 mm, more preferably less than 1 mm. The etchant gas 2303 may be a mixture of an etching agent and an inert gas. Although the electrical contact elements 2203A and 2203C in FIG. 6 are shown to be independent from the nozzle assembly 2300, such contact elements may also be in the form of probes, preferably spring loaded probes, integrated with or attached to the nozzle assembly 2300 such that the probes may physically touch and thus make electrical contact to the top surface 2204A of the semiconductor layer 2204 at predetermined contact regions or points at the ends of the arms of the test pattern 2202 when the nozzle assembly is lowered towards the wafer surface and the exhaust gap 2306 shown in FIG. 6 is established (also see FIG. 6AA). It is also possible to place the electrical contact elements 2203A and 2203C into the exhaust channel 2304 where a low concentration of the waste gas 2303W further diluted by the barrier gas 2307 flows.

Figure 6B:
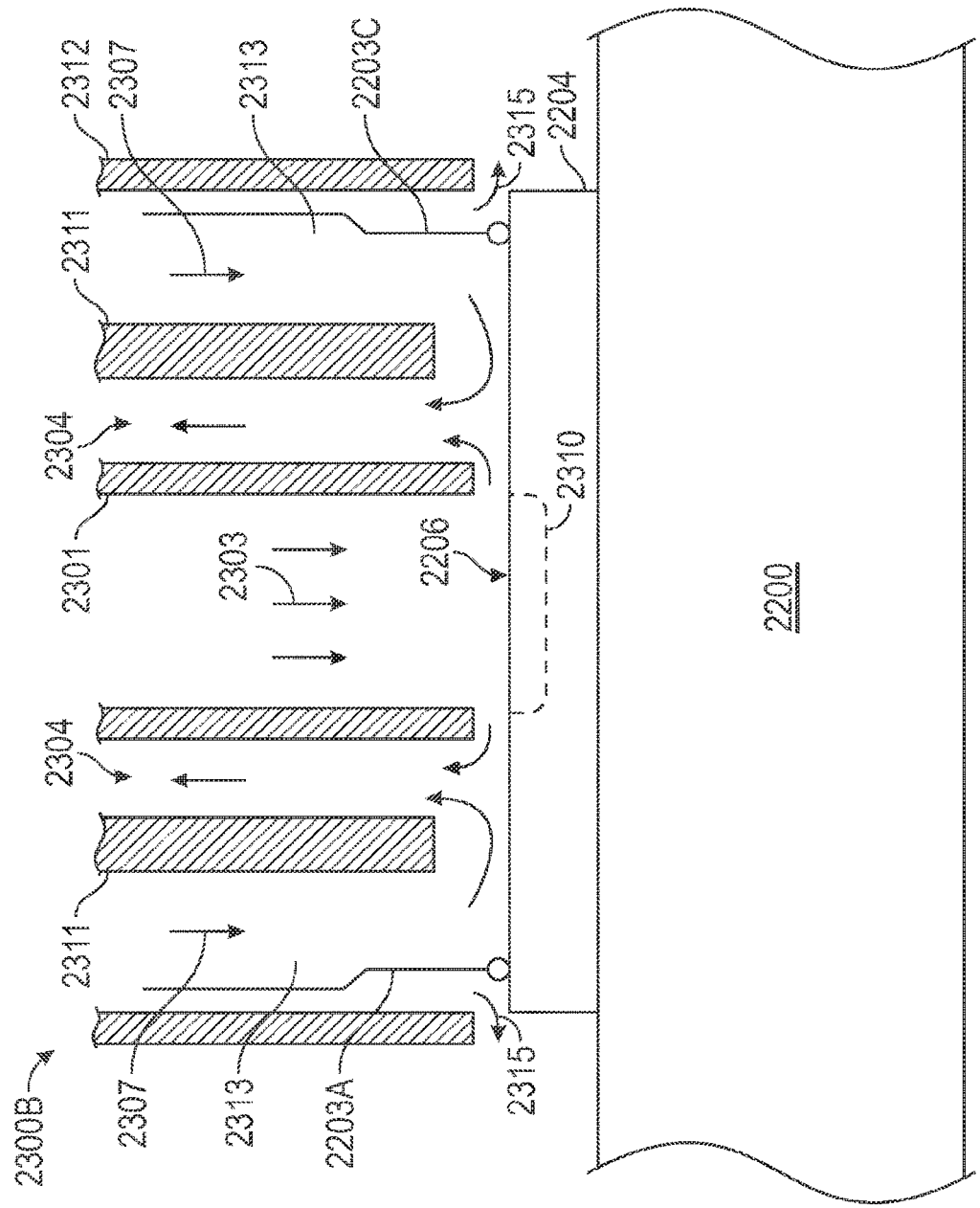
FIG. 6B is a sketch of yet another nozzle assembly with at least one barrier gas inlet channel as well as at least one exhaust channel.

In another embodiment shown in FIG. 6B a nozzle assembly 2300B may comprise the nozzle 2301, the exhaust channel 2304 and the outer wall 2311 of FIG. 6, but these components may be surrounded by a barrier wall 2312 that may form a barrier gas inlet channel 2313 between the outer wall 2311 and the barrier wall 2312. During operation, the barrier gas 2307, which may preferably be an inert gas, may be forced down towards the wafer 2200 through the barrier gas inlet channel 2313. The flow of the barrier gas 2307 into the exhaust channel 2304, and into the enclosure (the flow into the enclosure shown by small arrows 2315), effectively isolates the test region 2206 gas environment from the chamber environment. In this case, the chamber may comprise near atmospheric ambient air and substantially all of the substrate or wafer may be kept in that environment except a small section where the measurements and etching processes are carried out. This approach is attractive since it reduces inert gas usage and it is an atmospheric process.

In yet another embodiment of a nozzle assembly 2300A shown in FIG. 6A the exhaust channel 2304 of FIG. 6 may be eliminated. In this configuration, the waste gas 2303W may be pushed out through the first gap 2306 into the enclosure 2401, which may have a secondary exhaust 2402 (see FIG. 7). Since the volume and the concentration of the etchant gas 2303 used in this process can be very low, when the waste gas 2303W enters the enclosure 2401, it may get substantially diluted by the atmosphere in the enclosure, which may be an inert gas flown into the enclosure. The waste gas as well as the inert gas in the enclosure may then be pushed out through the secondary exhaust line 2402 shown in FIG. 7. This approach may be used in applications where an extremely low flow rate of etchant gas 2303 may be employed (for example less than 0.0001 sccm), to process a very small test area, for example 50 microns diameter and the etchant gas 2303 is delivered through small channel (such as 50 microns diameter).

Figure 7:
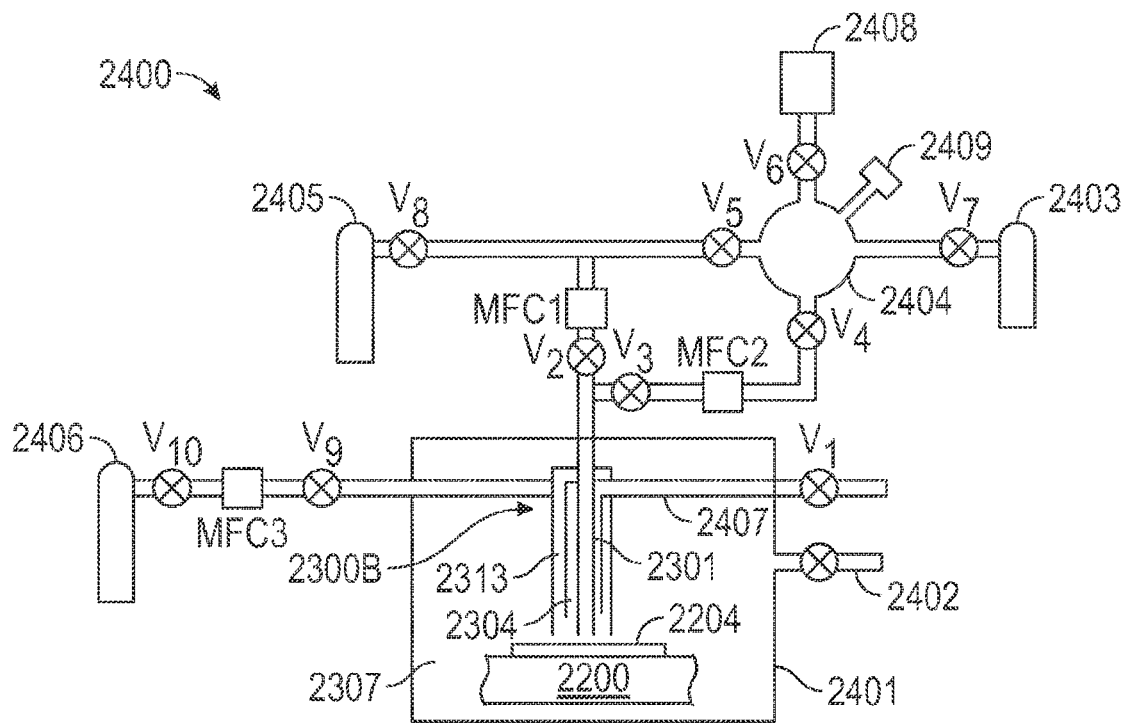
FIG. 7 is an exemplary apparatus or system that can be used to obtain a depth profile of the electrical properties of a thin semiconductor layer.

FIG. 7 shows a preferred embodiment of an exemplary tool or system 2400 that may be used to measure electrical property profiles of a semiconductor layer disposed on a substrate such as a wafer. The system 2400 may comprise an enclosure 2401 within which the nozzle assembly 2300B and the wafer 2200 shown in FIG. 6B may be placed. It should be noted that any of the nozzle assemblies shown in FIGS. 6, 6A, 6B, 6AA and 6AAA may be used in the system 2400 by making the necessary minor adjustments in the design. The system 2400 may further comprise an etching agent source 2403, a pressure bottle 2404, a carrier gas source 2405, a barrier gas source 2406 and various valves (V1, V2, V3, V4, V5, V6, V7, V8, V9, V10) and mass flow controllers (MFC1, MFC2, MFC3) to regulate and control the flow of various gases. Operation of the system 2400 will now be described using $XeF_2$ as the exemplary etching agent, which is a solid with a vapor pressure of ~4 Torr at 25° C.

During operation, the enclosure 2401 may comprise ambient air at atmospheric or ambient pressure. The valve V6 may be opened and a vacuum pump 2408 may evacuate the pressure bottle 2404 to a base pressure as monitored by a pressure gauge 2409. The base pressure may be less than about 20 mTorr, preferably less than about 10 mTorr to eliminate air and water vapor. The valve V6 may then be closed and the valve V7 may be opened to transfer a controlled amount of the etching agent vapor from the etching agent source 2403 into the pressure bottle 2404. When a predetermined etching agent pressure is reached in the pressure bottle 2404, the valve V7 may be closed and the valves V5 and V8 may be opened to bring a carrier gas from the carrier gas source 2405 into the pressure bottle 2404 until a predetermined etchant gas pressure is reached in the pressure bottle 2404 at which time the valve V5 may be closed. This way an etchant gas, which is a mixture of the etchant agent and the carrier gas, is prepared in the pressure bottle 2404. The etchant gas pressure in the pressure bottle 2404 may preferably be higher than the atmospheric pressure so that it may become the driving force for flowing the etchant gas to the nozzle assembly 2300B as we will review next.

Before initiating the local etching of the semiconductor layer by the etchant gas, valves V9, V10 and V1 may be turned on to establish a barrier gas flow from the barrier gas source 2406 through the MFC3 to the barrier gas channel 2313, to the exhaust channel 2304 and exhaust line 2407. The valve V2 may also be opened for a short time to flush out any ambient air that may be present in the gas nozzle 2301 by the carrier gas from the carrier gas bottle 2405. To initiate local etching of the semiconductor layer 2204 as described with respect to FIG. 6, the valves V4 and V3 may then be opened to direct the etchant gas from the pressure bottle 2404 to the gas nozzle 2301 through MFC2. If further dilution of the etchant gas by the carrier gas is desired to obtain even lower etch rates, the valve V2 may also be opened to introduce more carrier gas controlled by MFC1 into the etchant gas stream. The carrier gas may comprise an inert gas such as nitrogen and argon.

The etching agent pressure in the pressure bottle 2404 may be less than about 4 Torr in this example. The etching agent pressure may preferably be in the 0.05-3.5 Torr range, more preferably in the 0.1-3 Torr range. The etchant gas pressure in the pressure bottle 2404 may be higher than 1000 Torr, preferably higher than 2000 Torr. For example, if the etching agent pressure is 0.5 Torr and the etchant gas pressure is 3000 Torr in a pressure bottle 2404, the percentage of the etching agent in the process gas or the etchant gas flow coming onto the surface of the semiconductor layer would be about 0.017%. This ratio is preferably less than 0.2%, more preferably less than 0.1%. This may be further diluted by additional carrier gas coming from the carrier gas bottle 2405 through valve V2, yielding semiconductor layer etching rates much lower than 1 nm/second, preferably lower than 0.2 nm/second. It should be noted that the flow rate of the etchant gas as regulated by MFC2 is another factor controlling the etching rate on semiconductor layer surface—lower flow rates generally yielding lower etch rates—therefore better resolution in the measurements for material property profiling.

Figure 7A:
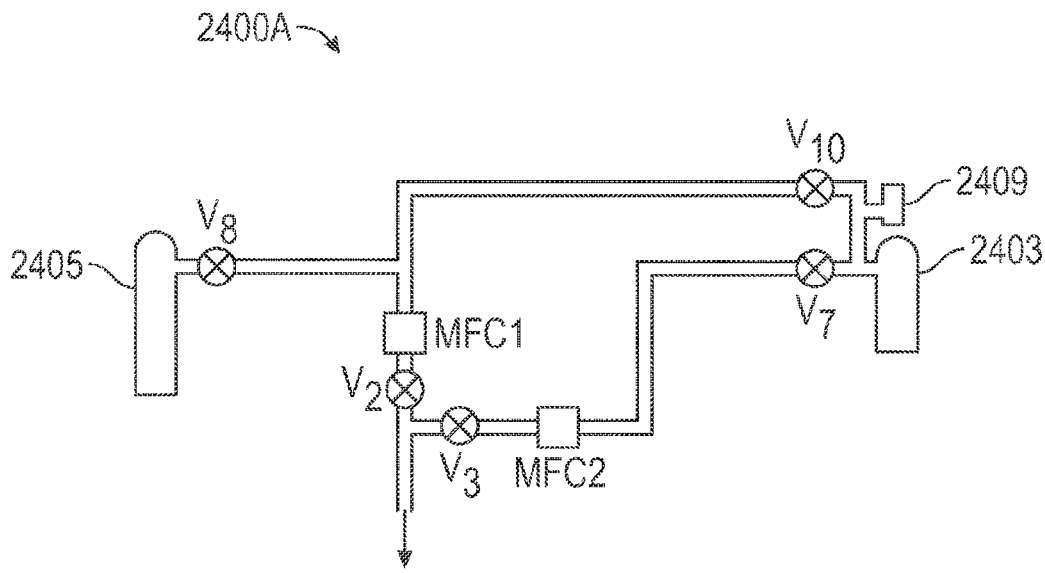
FIG. 7A shows an alternative process gas or etchant gas delivery system.

It should be noted that use of the pressure bottle 2404 in FIG. 7 provides the flexibility of changing the amount of the etching agent in the etchant gas in a wide range. It would also be possible to eliminate the pressure bottle 2404 and simply open valve V8 and V10, pressurize the etchant agent source 2403 by the carrier gas from the carrier gas source 2405 to set an etchant gas pressure (measured by the pressure gauge 2409) within the etchant agent source 2403 (see the alternative etchant gas delivery system 2400A in FIG. 7A). The etchant gas pressure may be over 1000 psi, preferably over 2000 psi. In this case, the partial pressure of the etchant agent in the etchant agent source 2403 would be its vapor pressure (~4 Torr at 25° C.) and it would not change until all of the solid $XeF_2$ is used. The percentage of the etchant agent in the etchant gas, however, would decrease as the volume of the used $XeF_2$ is replaced by the carrier gas (assuming same total pressure). This percentage can be kept constant, however, by reducing the carrier gas pressure in the etchant gas pressure within the etchant agent source 2403 as the solid $XeF_2$ gets consumed. The design in FIG. 7A may be used in applications where etching is carried out within the scribe lines of a patterned wafer. As described before, in such applications the etchant gas may be delivered over a 20-100 micrometer size region using channels that have similar cross sectional areas. The etchant gas flow rates needed in such applications may be much lower than 0.001 sccm and therefore mass flow controller MFC2 in FIG. 7A may not be used. By replacing MFC2 with a fixed orifice, the flow rate of the etchant gas may be set to any value desired (such as 0.0001 sccm or 0.00001 sccm) as long as the etchant gas pressure is kept constant by replenishing the carrier gas into the etchant agent source 2403. In such applications, it may be important to measure the electrical characteristics of a semiconductor layer for its top <5 nm region, preferably <3 nm region. In this case, the etching process may be limited to that etch depth without damaging the wafer by etching deeper.

Figure 8A:
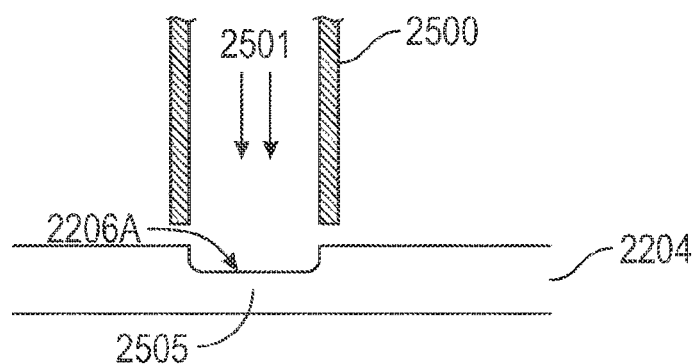
FIGS. 8A and 8B show a process wherein a portion of a semiconductor layer at a test region is etched in a non-contact manner employing a nozzle assembly, and then measurements are carried out at the test region after the nozzle assembly is moved away.
Figure 8B:
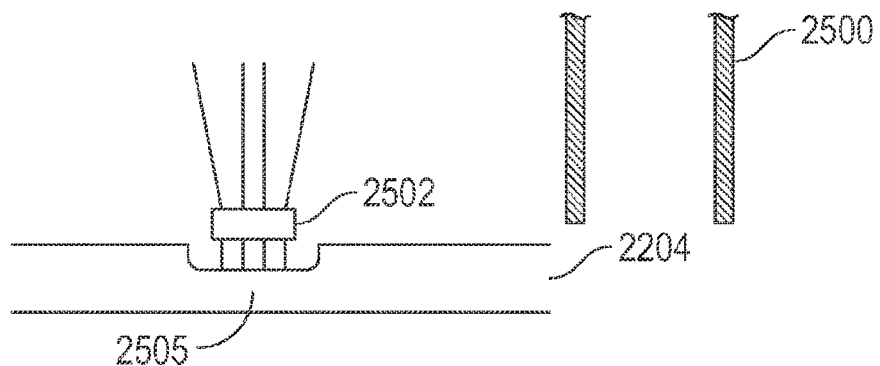

In yet another embodiment, gaseous chemical etching of the semiconductor layer and the measurement of its properties, such as electrical properties, may be carried out consecutively by moving in and out the electrical contact elements or the nozzle assembly. For example, FIG. 8A shows a simplified nozzle 2500 that may have etched or thinned down a test layer portion of the semiconductor layer 2204 at a testing area 2206A using an etching gas 2501 leaving behind a thinned down test layer portion 2505. As shown in FIG. 8B the simplified nozzle 2500 may then be moved away and a measurement assembly 2502 may be lowered towards the semiconductor layer 2204 to measure a material property of the thinned down test layer portion 2505. The etching and measurement steps may then be repeated to obtain a profile. The measurement assembly may comprise a 4-point probe or other probe systems that may contact the semiconductor layer 2204 at predetermined locations to make the measurement. It should be noted that although the simplified nozzle 2500 shown in FIGS. 8A and 8B is similar to the one shown in FIG. 6A, the preferred nozzle assembly for this embodiment may be the designs shown in FIGS. 6, 6B, 6AA, and 6AAA. This way during the etching step shown in FIG. 8A, an etchant gas environment may be limited to the area being etched only, with the rest of the wafer and the measurement assembly 2502 staying in ambient air.

In yet another embodiment, the measurement assembly 2502 may carry out measurements as the etching gas 2501 may be delivered onto the test layer portion 2505 of the semiconductor layer 2204 by the nozzle 2500. In this case there may be no need for the nozzle 2500 to move away for the measurements. However, since the measurement assembly is left in a flow of the etching gas 2501, its components need to be selected such that they do not get etched or otherwise negatively impacted by the etching gas.

It should be noted that systems using the exemplary nozzles of the present inventions may comprise more than one nozzle for increased measurement throughput and for carrying out measurements at multiple locations over a wafer simultaneously. It is also possible that the exemplary tool of FIG. 7 may comprise more than one pressure bottle 2404 and each pressure bottle may comprise a different amount of the etching agent. For example, the semiconductor layer to be characterized may comprise a thin oxide layer on its surface that may require a higher concentration of the etching agent to get etched. In this case at the beginning of the etching process a more concentrated etchant gas from a first pressure bottle may be used to remove the oxide and then a more dilute etchant gas from a second pressure bottle may be utilized for the rest of the etching process. It should also be noted that an in-situ measurement of the thickness of the material removed from the test region may be achieved by integrating an optical detector with a light beam directed onto the surface of the test region being etched.

In the preferred embodiments described above a test region where semiconductor material is etched by the gaseous species is, at least partially, defined either by a seal or by the geometry of a nozzle employed to direct an etchant gas onto the semiconductor material. Preferred embodiments described below employ a resist spacer wherein the resist spacer may be formed over the top surface of a material property measurement test pattern provided in the semiconductor layer to be characterized. The resist spacer of these inventions may comprise a window that may expose a test region on the top surface of the test pattern. During the process, a process chamber may be lowered onto the resist spacer such that an open end of the process chamber may seal against, preferably, the top side of the resist spacer forming a process cavity. A liquid or gaseous etchant or oxidizing agent may then be introduced into the process cavity and etching or oxidation process may be performed at the test region. Electrical measurements may be carried out using contacts made to the test pattern outside the process chamber either after the etching/oxidation step or as the gaseous etching step is performed. Some of the benefits of the resist spacer include protection of the surface of the test pattern from damage by the seal, uniform material removal or oxidation through the window, possibility to miniaturize the test region and the highly accurate definition of the test region which is especially important for wet electrochemical oxidation or etching approaches. It should be noted that the resist spacer may also be employed in a gaseous etching process wherein a nozzle (such as those depicted in FIG. 6, FIG. 6A, FIG. 6B, and FIG. 6AA) may be lowered to close proximity of the resist spacer without touching it. A gaseous etchant agent may then be directed towards the test region. Electrical measurements may then be carried out using contacts made to the test pattern as the gaseous etching step may be performed. Some of the benefits of the resist spacer in this case include uniform material removal, possibility to miniaturize the test region and the highly accurate definition of the test region.

Figure 9A:
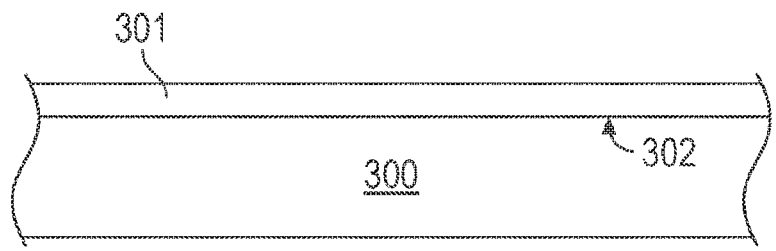
FIGS. 9A, 9B, 9C and 9D show a procedure for obtaining an electrical property profile of a semiconductor film or layer in accordance with a preferred embodiment of the present inventions.
Figure 9B:
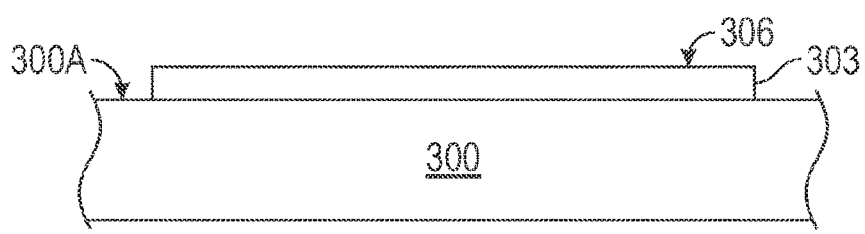
Figure 9C:
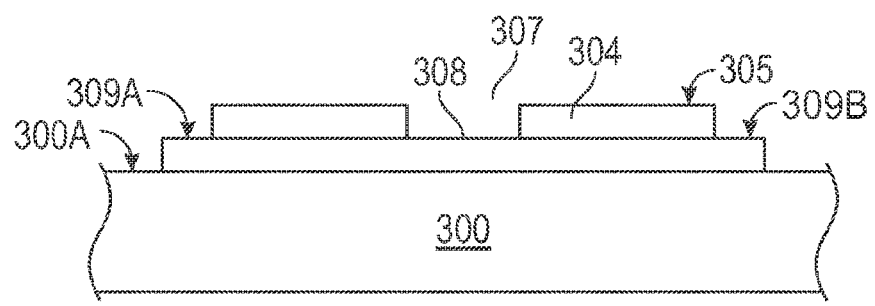

FIGS. 9A, 9B, 9C and 9D describe a method or procedure for obtaining an electrical property profile of a semiconductor film or layer in accordance with a preferred embodiment of the present inventions. FIG. 9A shows a semiconductor layer 301 for which an electrical profile may be obtained. The semiconductor layer 301 may be disposed over an upper surface 300A of a substrate 300 (see FIG. 9B). There may be an insulating or high resistance interface 302 between the semiconductor layer 301 and the upper surface 300A of the substrate 300. The high resistance interface 302 may comprise a rectifying junction, a buffer layer, a high resistivity film or an insulating film such as in Silicon On Insulator—SOI structures. First, a test pattern 303 with a top surface 306 may be prepared or formed out of the semiconductor layer 301. This may be achieved using techniques such as laser scribing, mechanical scribing, photolithography or resist deposition followed by gaseous or wet chemical etching, etc., that may remove sections of the semiconductor layer 301 from around the test pattern 303, thus electrically isolating the test pattern 303 from the rest of the semiconductor layer 301. Next, as shown in FIG. 9C, a resist spacer 304 may be formed over the top surface 306 of the test pattern 303, the resist spacer 304 comprising a top side 305 and a window 307 that exposes a test region 308 on the top surface 306 of the test pattern 303. The resist spacer 304 may also expose one or more contact regions 309A and 309B over the top surface 306 of the test pattern 303. During the next step of the procedure an open end of a process chamber 310 may be disposed over the test region 308 forming a process cavity 311. The process cavity may be sealed using a seal 312, which may comprise a pliable elastic material. In the preferred embodiment shown in FIG. 9D the process chamber 310 seals against the top side 305 of the resist spacer 304 to avoid possible damage to the test pattern 303 as discussed before. One or more electrical contact elements 313A and 313B may then be applied to the top surface 306 of the test pattern 303 at the one or more contact regions 309A and 309B. In a preferred embodiment, the one or more electrical contact elements 313A and 313B may be attached to the process chamber 310 by attachments 314 so that when the process chamber 310 is brought to close proximity of the test region 308, tips 315A and 315B of the electrical contact elements 313A and 313B may touch the top surface 306 of the test pattern 303 at the contact regions 309A and 309B establishing electrical contact.

Referring back to FIGS. 9A-9D, the semiconductor layer 301 may have a thickness in the range of 1-50 nm, whereas the thickness of the substrate 300 may be larger than 200,000 nm. The substrate 300 may preferably be a semiconductor wafer with a diameter larger than or equal to 10 cm. The test pattern 303 may be a pattern that can be used for sheet resistance and mobility measurements such as a Van Der Pauw type structure shaped as a rectangle, square, circle, clover leaf, bar or cross (see for example, Keithley Application Note Series Number 3180). The exemplary test pattern 303 in FIG. 9B is a cross-shaped pattern. The resist spacer 304 may comprise a material that is resistant to the solutions or dry gases that may be brought or flown into the process cavity 311. The resist spacer 304 may be deposited or fabricated using techniques such as photolithography, screen printing, roller coating and preferably inkjet printing. The resist spacer 304 may have a thickness in the range of 100-10,000 nm, preferably in the range of 500-5,000 nm, and more preferably in the range of 1,000-5,000 nm. An area of the test region 308 may be smaller than about 0.2 cm$^2$, preferably smaller than about 0.1 cm$^2$, and most preferably smaller than about 0.02 cm$^2$. The process chamber 310 may have one or more inlets 316 to bring or flow liquid chemicals and/or gases into the process cavity 311, and one or more outlets 317 to take or flow used liquid chemicals and/or gaseous reaction products out of the process cavity 311.

Figure 9D:
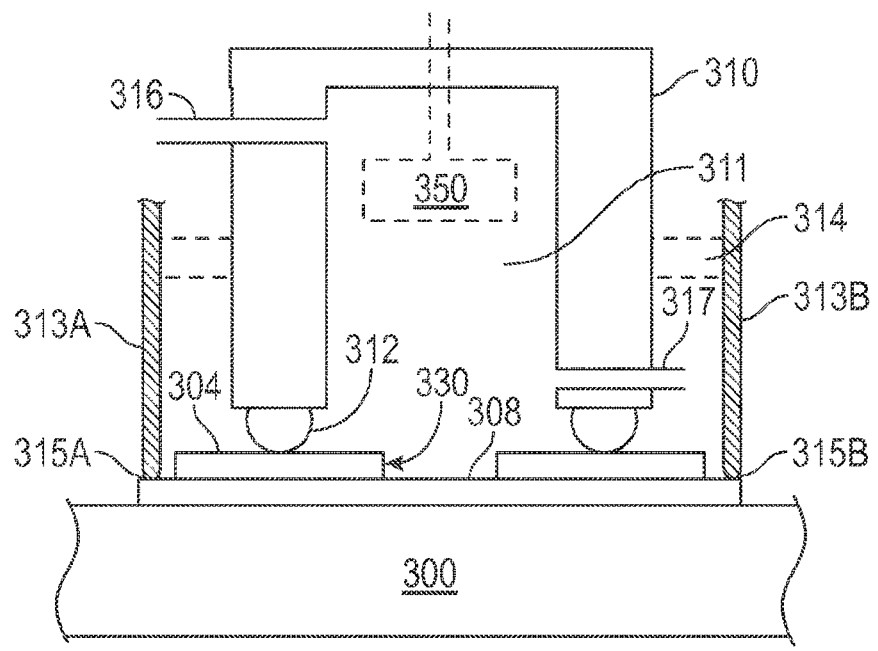
Figure 10A:
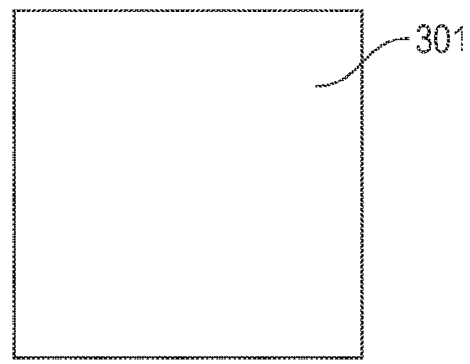
FIGS. 10A, 10B, 10C and 10D show top views of structures depicted in FIGS. 9A, 9B, 9C and 9D, respectively, wherein an exemplary cross-shaped test pattern is employed.
Figure 10B:
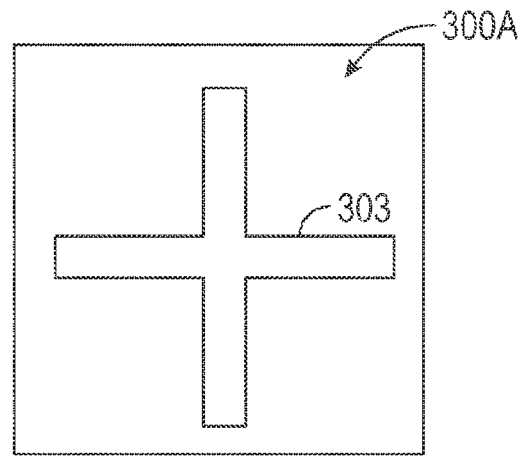
Figure 10C:
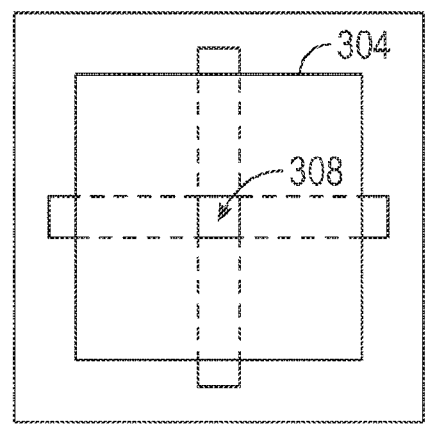
Figure 10C:
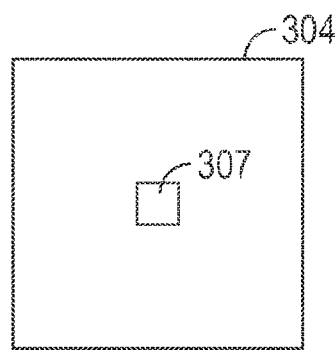
Figure 10D:
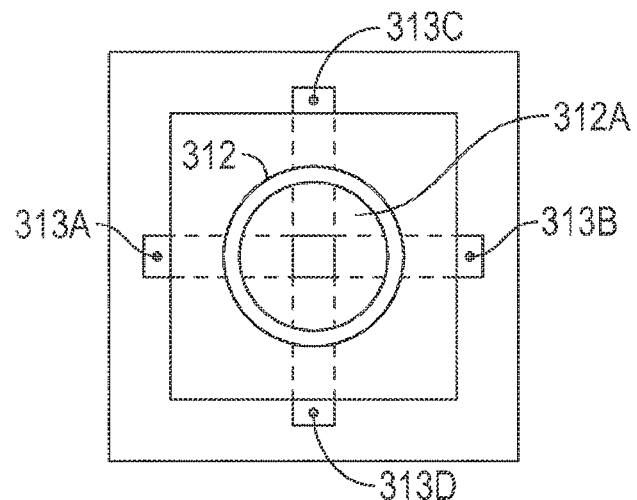

FIGS. 10A, 10B, 10C and 10D show the top views of the exemplary structures depicted in FIGS. 9A, 9B, 9C and 9D, respectively. In FIG. 10A the semiconductor layer 301 can be seen. In FIG. 10B the test pattern 303 is in the form of a cross and the upper surface 300A of the substrate 300 is visible around the test pattern 303. FIG. 10C shows the resist spacer 304 disposed over the test pattern 303. There is a window 307 in the middle of the resist spacer 304 as shown in FIG. 10CC and the window 307 exposes the test region 308 on the test pattern 303. As can be seen the test region 308 is substantially the same as the area where the four arms of the cross-shaped test pattern 303 meet together. FIG. 10D shows the location of the seal 312 over the resist spacer 304. Electrical contacts 313A, 313B, 313C and 313D are placed at the ends of the four arms of the test pattern 303. As can be seen from FIG. 10D, an area 312A surrounded by the seal 312 is larger, preferably substantially larger, for example at least four times larger, than the area of the test region 308.

Referring to FIGS. 9D and 10D an exemplary procedure of obtaining a depth profile of an electrical property of the semiconductor layer 301 may be carried out as follows.

During the first step of the measurement procedure the electrical property of the semiconductor layer 301 may be measured. To measure the sheet resistance, for example, a first current may be passed between the contacts 313A and 313D through the test region 308 and a first induced voltage may be measured between the contacts 313C and 313B. To measure the Hall coefficient a second current may be passed between contacts 313A and 313B through the test region 308, in presence of a magnetic field that is substantially perpendicular to the top surface 306 (see FIG. 3B), and a second induced voltage may be measured between contacts 313C and 313D. From these measurements a first sheet resistance value and a first Hall coefficient value may be calculated for the semiconductor layer 301 using well known mathematical expressions. During the second step of the measurement procedure chemical species may be introduced into the process cavity 311 to oxidize or remove a predetermined portion of the semiconductor layer 301 at the test region 308 and then the sheet resistance and Hall coefficient measurements described above may be repeated. Differences between the measurements before the material removal/oxidation at the test region 308 and the measurements after the material removal/oxidation may then be used to calculate a data point. By repeating the measurement and material removal/oxidation steps one can obtain the full depth profile of the electrical property of the semiconductor layer 301.

It should be noted that the chemical species used for oxidation may be an anodic oxidation solution (not shown), in which case a cathode 350 may be disposed in the process cavity 311 so that the cathode 350 touches the anodic oxidation solution. Alternately, a process solution may be used to carry out a voltage-induced wet dissolution process as described before. The cathode 350 serves as an electrode in this case and an anodic or cathodic voltage may be applied to the semiconductor layer 301. It is also possible to use a solution-based chemical etching process by introducing a chemical etchant solution into the process cavity 311. The chemical species may also be gaseous as described in previously described preferred embodiments. In any case, material removal or oxidation may be achieved in a uniform manner through the window 307 in the resist spacer 304.

Figure 11A:
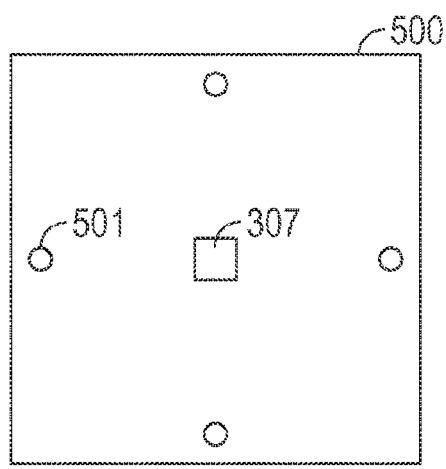
FIG. 11A is a top view of a resist spacer with contact openings.
Figure 11B:
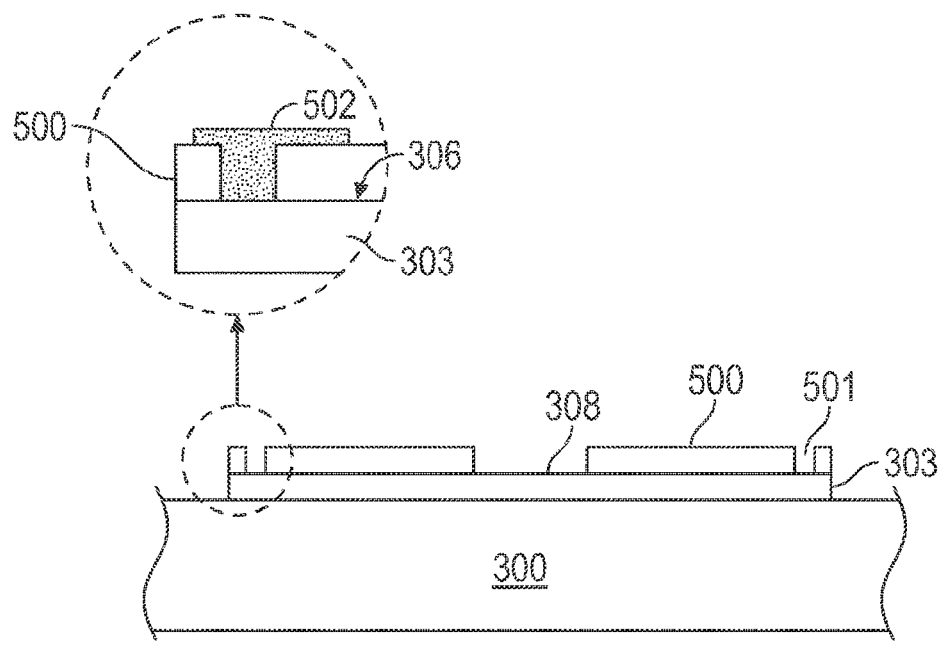
FIG. 11B shows a side view of a structure formed with the resist spacer of FIG. 11A disposed over a test pattern. The expanded view shows an electrical contact pad deposited through a contact opening in the resist spacer.

There are several benefits the present inventions may offer:

i) Use of a resist spacer 304 may prevent damage that may be caused by the seal 312 to the test pattern 303 as was discussed in relation to FIG. 2. Since the seal 312 may physically touch the top side 305 of the resist spacer 304 rather than the fragile and electrically active top surface 306 of the test pattern 303, more pressure may be safely applied for better sealing without concern about damage to the test pattern 303. It should be noted that in applications where the test pattern 303 may not be fragile the resist spacer does not have to extend all the way to underneath the seal 312. With such a design, the remaining benefits listed below would still apply.

ii) Uniform material removal or oxidation may be achieved through the window 307 in the resist spacer 304 because the thick seal 312 is moved away from the edge or circumference of the test region 308, eliminating the non-uniformities that may be introduced by the small angle corner and the high wall caused by the presence of the seal as described in reference to FIG. 2A. It should be noted that the thickness of the resist spacer 304 may be in the range of only 100-10,000 nm, whereas the thickness of the seal 312 may be in the range of 100,000-1,500,000 nm. Therefore, a sidewall 330 of the resist spacer 304 (see FIG. 9D) does not present a small angle sharp corner and a high wall to the process chemicals as a large seal would.

iii) Use of the resist spacer 304 may enable miniaturization of the test region 308. If the seals were to define the area of the test region 308, it would be very difficult or impossible to reduce that area to micron levels because of the non-uniformities discussed above and the physical limitation of using relatively large seals. By defining the test region by a thin resist spacer 304, it is possible to reduce the area of the test region to below 0.0001 cm$^2$, and even to 0.00002 cm$^2$ or less. In principal, using this approach one could make direct measurements through a high mobility channel of a transistor by connecting the contacts to an area outside the seal 312 using connection lines under the resist spacer 304.

iv) For approaches utilizing solutions in the process cavity 311, moving the seal 312 away from the test region 308 may avoid formation of gas bubbles over the test region 308, which tend to grow at sharp low angle corners. It should be noted that such gas bubbles would reduce etching/oxidation in areas they stick to and increase etching/oxidation in the other areas, which would receive higher than normal current density or chemical etching action.

v) For approaches utilizing an anodic oxidation process, the cathode 350 (see FIG. 9D) may be brought down in close proximity of the resist spacer 304, or it may be touched to the top side 305 of the resist spacer 304 without electrically shorting to the test region 308. Such close-space anodic oxidation may improve anodic oxidation uniformity within the test region 308.

vi) Use of the resist spacer 304 may also enable an accurate in situ measurement of the thickness of the material removed from the test region 308. Referring back to FIG. 9D, as an example, the cathode 350 may be replaced by an optical detector that monitors an area around the test region 308. The optical detector may be an interferometric detector that may measure a distance between the top side 305 of the resist spacer 304 and a level of the test region 308. Without any etching, the optical detector would measure a height of the sidewall 330 of the resist spacer 304 (in other words the thickness of the resist spacer 304) because the level of the test region 308 coincides with the top surface 306 of the test pattern. As the material at the test region 308 is etched away or removed, preferably using gaseous species, the optical detector would sense the height difference between the top side 305 of the resist spacer (which does not get etched) and the level of the test region 308 which starts to go down. This height difference may provide the thickness of the material removed from the test region 308, which may then be used in plotting the accurate depth profiles of the measured electrical properties. It should be noted that the optical detector may function continuously as etching and electrical measurements may be performed in stepwise or continuous manner.

vii) FIG. 11A shows a top view of an example of a contact defining resist spacer 500 comprising a window 307 (similar to FIG. 10CC) and four contact openings 501. As can be seen from the side view in FIG. 11B, when the contact defining resist spacer 500 is disposed over the test pattern 303 it exposes small portions of the top surface 306 of the test pattern 303 through the contact openings 501. As can be seen from the magnified inset in FIG. 11B, electrical contact pads 502 may be deposited through the contact openings 501 to establish electrical contact with the top surface 306 of the test pattern 303. Such an approach may have a benefit of avoiding possible damage by electrical contact elements (such as the electrical contact elements 313A and 313B shown in FIG. 9D) to the top surface 306 of the test pattern 303 since in this case electrical contact elements may touch only the electrical contact pads 502. Also as the dimensions of the test pattern 303 are reduced it may become more and more difficult to place the tips 315A and 315B of the electrical contact elements 313A and 313B (FIG. 9D) properly over the test pattern 303. The design of FIG. 11B may provide larger electrical contact pads 502 that can be more easily touched by electrical contact elements without damage to the test pattern 303 and without concern about electrical shorts. It should be noted that the contact pads 502 of FIG. 11B may be formed by depositing a conductive material such as injecting a conductive ink or paste over the contact openings 501 of the contact defining resist spacer 500.

viii) The resist spacer 304 of FIG. 10CC and the contact defining resist spacer 500 of FIG. 11A define an area of the test region 308 exactly and accurately. Defining an area of a test region by elastomer seals may not be accurate. Knowing the area of a test region accurately is important, especially for anodic oxidation processes and voltage-induced dissolution processes because to determine a thickness of the material oxidized or material removed, one needs to know the current density, which is the value that is obtained by dividing the current passed through the test region by the area of the test region.

Figure 12:
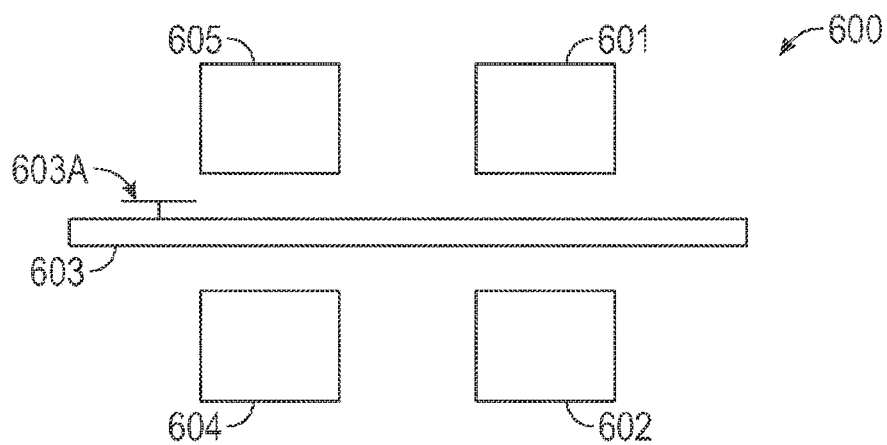
FIG. 12 shows an integrated system comprising multiple process stations.

An integrated system 600 to perform at least some of the procedures or process steps shown in FIGS. 9B, 9C and 9D is schematically shown in FIG. 12. The integrated system 600 may comprise at least a resist spacer formation station 601 and a measurement station 602. A carrier 603 with a substrate holder 603A may move a substrate between various stations, the substrate comprising a test pattern as shown in FIGS. 9B and 10B. The carrier 603 may first deliver the substrate with the test pattern to the resist spacer formation station 601 where a resist spacer (such as the ones shown in FIGS. 10CC and 11A) may be formed over the test pattern. The resist spacer formation station 601 may preferably comprise an inkjet printing head that may deposit the resist material over the test pattern in the form of a predetermined resist spacer design. The carrier 603 may then deliver the substrate with the test pattern and the resist spacer to the measurement station 602. The measurement station 602 may comprise a process chamber such as the one shown in FIG. 3D or any of the nozzle designs discussed previously. The process chamber or the nozzles may be configured to provide solutions or etching gases to a test region defined by a window in the resist spacer over the surface of the test pattern. The measurement station 602 may also comprise electrical components and systems as well as magnets to make the necessary measurements at the test region of the test pattern. The integrated system 600 may additionally comprise a contact pad fabrication station 604. The contact pad fabrication station 604 may comprise a conductor deposition apparatus such as a liquid or paste contact pad material delivery tool to form contact pads over the test pattern. One such exemplary method of preparing contact pads was described in relation with FIG. 11B. The contact pad material delivery tool may be an inkjet printer head, a syringe, a dispenser, etc. The integrated system 600 may also comprise a test pattern formation station 605. The test pattern formation station 605 may receive a substrate with a semiconductor layer disposed on it (such as the one shown in FIGS. 9A and 10A) and it may prepare a test pattern (such as the one shown in FIGS. 9B and 10B) by removing unwanted portions of the semiconductor layer from the substrate. The test pattern formation station 605 may comprise a semiconductor removal tool that may be used to form the test pattern. The semiconductor removal tool may comprise a laser scriber, a gaseous or liquid etching tool, an oxidation tool that may turn the unwanted portions of the semiconductor layer around the test pattern into an oxide, or a mechanical scribing tool that removes a narrow portion of the test pattern to electrically isolate it from the rest of the semiconductor layer.

In an exemplary process flow, the carrier 603 may first deliver a substrate with a semiconductor layer disposed on it to the test pattern formation station 605 of the integrated system 600. After the formation of at least one test pattern over the substrate, the carrier 603 may deliver the substrate to the resist spacer formation station 601. After the formation of a resist spacer over the test pattern the substrate may be delivered to the contact pad fabrication station 604. Then, the substrate coming out of the contact pad fabrication station 604 may be delivered to the measurement station 602 to obtain the electrical property profiles of the semiconductor layer. Although a linear carrier 603 is depicted in FIG. 12, a rotating carousel or any other design may also be used to transfer the substrate between various stations.

Although the present inventions were mostly described giving as an example measuring an electrical property, such as resistivity, mobility, carrier concentration, and magnetoresistance of a semiconductor layer as a portion of the semiconductor layer was thinned down by chemical reaction with gaseous species, it should be understood that the semiconductor layer may be replaced by other materials such as a metal, a semi-metal or a high resistivity material to carry out the measurements on such other materials. Also other material properties such as optical or electro-optical material properties (e.g. reflectivity, photoconductivity) and physical material properties (e.g. strain, stress) of material layers may also be measured as a function of depth, in-situ, as the material layers are thinned down at a test region by etchant gases directed to the test region as described herein, and the measurements are carried out on the remaining un-etched portion of the material layers at the test region.

Therefore, according to the above, some examples of the disclosure are directed to a method of obtaining a depth profile of a material property through a layer, the layer comprising a top surface and a test region, the method comprising the steps of: measuring the material property of the layer at the test region, delivering a process gas onto the top surface of the layer at the test region, chemically etching a predetermined thickness of the layer at the test region using the process gas to form a trench with a depth in the layer at the test region and leaving behind a remaining portion of the layer at the test region, and measuring the material property of the remaining portion of the layer at the test region. Additionally or alternatively to one or more of the examples above, in some examples, the steps of delivering, chemically etching and measuring the material property of the remaining portion are repeated until the depth of the trench reaches a final value. Additionally or alternatively to one or more of the examples above, in some examples, the step of chemically etching is carried out at a predetermined etching rate of less than 5 nm/second. Additionally or alternatively to one or more of the examples above, in some examples, the predetermined etching rate is less than 1 nm/second. Additionally or alternatively to one or more of the examples above, in some examples, the layer is a semiconductor layer. Additionally or alternatively to one or more of the examples above, in some examples, the material property of the semiconductor layer is an electrical property. Additionally or alternatively to one or more of the examples above, in some examples, the final value of the trench depth is less than 50 nm. Additionally or alternatively to one or more of the examples above, in some examples, the method further comprises the step of placing the layer in a containment chamber before the step of measuring the material property of the layer at the test region, and wherein the containment chamber is at atmospheric pressure. Additionally or alternatively to one or more of the examples above, in some examples, the containment chamber comprises air. Additionally or alternatively to one or more of the examples above, in some examples, the semiconductor layer is in the shape of a test pattern, and wherein the step of measuring the material property of the remaining portion comprises electrically contacting the test pattern at contact regions. Additionally or alternatively to one or more of the examples above, in some examples, the contact regions are located outside the test region. Additionally or alternatively to one or more of the examples above, in some examples, the electrical property is mobility and a magnetic field is applied to the test region during the step of measuring the material property of the remaining portion, wherein the magnetic field is substantially perpendicular to the top surface. Additionally or alternatively to one or more of the examples above, in some examples, the electrical property is mobility and a magnetic field is applied to the test region during the step of measuring the material property of the remaining portion, wherein the magnetic field is substantially perpendicular to the top surface. Additionally or alternatively to one or more of the examples above, in some examples, the process gas comprises an etching agent comprising a halogen. Additionally or alternatively to one or more of the examples above, in some examples, the etching agent is $XeF_2$. Additionally or alternatively to one or more of the examples above, in some examples, a percentage of the etching agent in the process gas is less than 0.1%. Additionally or alternatively to one or more of the examples above, in some examples, an area of the test region is smaller than 0.04 $cm^2$. Additionally or alternatively to one or more of the examples above, in some examples, the area of the test region is smaller than 0.0001 $cm^2$. Additionally or alternatively to one or more of the examples above, in some examples, the step of delivering the process gas onto the top surface at the test region comprises bringing a process chamber comprising one or more walls and an open end into physical contact with the top surface so that the open end seals against the top surface forming a confined process space surrounded by the one or more walls of the process chamber exposing the test region to the confined process space, and introducing the process gas into the confined process space and establishing a process pressure. Additionally or alternatively to one or more of the examples above, in some examples, the method further comprises a step of removing the process gas from the confined process space after the step of chemically etching and before the step of measuring the material property of the remaining portion. Additionally or alternatively to one or more of the examples above, in some examples, the semiconductor layer is placed in a containment chamber and the containment chamber is at atmospheric pressure. Additionally or alternatively to one or more of the examples above, in some examples, the process pressure is atmospheric pressure. Additionally or alternatively to one or more of the examples above, in some examples, the measuring the material property of the remaining portion occurs while performing the chemical etching. Additionally or alternatively to one or more of the examples above, in some examples, the process gas is delivered to the top surface of the layer at the test region, but not to the top surface of the layer at another region, different than the test region. Additionally or alternatively to one or more of the examples above, in some examples, the layer is chemically etched at the test region, but is not chemically etched at the another region.

Some examples of the disclosure are directed to a method of obtaining an electrical property depth profile through a semiconductor layer comprising: providing a test pattern from the semiconductor layer, the test pattern having a top surface, a test region and contact areas, bringing a process chamber comprising one or more walls and an open end into physical contact with the top surface so that the open end seals against the top surface forming a confined process space wherein the test region is exposed to the confined process space, measuring the electrical property of the semiconductor layer at the test region using the test pattern, introducing a process gas into the confined process space establishing a process pressure, etching a predetermined thickness of the semiconductor layer at the test region using the process gas at an etching rate and leaving behind a remaining portion of the semiconductor layer, and measuring the electrical property of the remaining portion of the semiconductor layer. Additionally or alternatively to one or more of the examples above, in some examples, the steps of introducing, etching and measuring are repeated to obtain the depth profile of the electrical property. Additionally or alternatively to one or more of the examples above, in some examples, the method further comprises a step of removing the process gas from the confined process space after the step of etching and before the step of measuring the electrical property of the remaining portion. Additionally or alternatively to one or more of the examples above, in some examples, the process pressure is atmospheric pressure. Additionally or alternatively to one or more of the examples above, in some examples, the process gas comprises a halogen. Additionally or alternatively to one or more of the examples above, in some examples, the etching rate is less than 1 nm/second.

Some examples of the disclosure are directed to an apparatus for obtaining a depth profile of a material property through a layer with a top surface and a test region comprising: a process chamber with one or more walls and an open end, a mechanism to establish a relative motion between the layer and the process chamber so that the open end of the process chamber may be moved towards the top surface to seal against the top surface forming a confined process space surrounded by the walls of the process chamber and exposing the test region to the confined process space, at least one inlet configured to bring a process gas into the confined process space to allow etching a predetermined thickness of the layer at the test region using the process gas during an etching period when the open end of the process chamber is sealed against the top surface, and a measurement system configured to measure the material property of the layer at the test region. Additionally or alternatively to one or more of the examples above, in some examples, the layer is a semiconductor layer. Additionally or alternatively to one or more of the examples above, in some examples, the material property is an electrical property. Additionally or alternatively to one or more of the examples above, in some examples, an area of the test region is smaller than 0.1 cm$^2$. Additionally or alternatively to one or more of the examples above, in some examples, the measurement system includes electrical contacts configured to touch the top surface outside the test region and a magnet configured to apply a magnetic field to the test region, the magnetic field being substantially perpendicular to the top surface of the semiconductor layer. Additionally or alternatively to one or more of the examples above, in some examples, the apparatus further includes at least one outlet configured to remove gaseous species from the process chamber after the etching period. Additionally or alternatively to one or more of the examples above, in some examples, the apparatus further includes a containment chamber enclosing the layer and the process chamber.

Some examples of the disclosure are directed to a method of obtaining a depth profile of a material property of a film with a top surface disposed at a measurement zone over a substrate with a total area, the method comprising the steps of: positioning a nozzle assembly within a threshold distance of the top surface without touching the top surface, the nozzle assembly comprising a nozzle, supplying an etchant gas to the nozzle, directing the etchant gas through the nozzle onto the top surface at a test region of the film, thinning down a test layer portion of the film at the test region, measuring the material property of the thinned down test layer portion, repeating the steps of directing, thinning down and measuring. Additionally or alternatively to one or more of the examples above, in some examples, the substrate and the nozzle assembly are disposed in an enclosure with an enclosure environment at atmospheric pressure. Additionally or alternatively to one or more of the examples above, in some examples, the material property is an electrical property. Additionally or alternatively to one or more of the examples above, in some examples, the film is a semiconductor film and the step of measuring comprises making at least one electrical contact to the top surface of the film with at least one electrical contact element. Additionally or alternatively to one or more of the examples above, in some examples, the at least one electrical contact is made to the top surface of the film outside the test region. Additionally or alternatively to one or more of the examples above, in some examples, the at least one electrical contact element is integrated with the nozzle assembly such that the step of positioning the nozzle assembly within the threshold distance of the top surface causes the at least one electrical contact element to touch the top surface thereby making the at least one electrical contact to the top surface. Additionally or alternatively to one or more of the examples above, in some examples, the enclosure environment comprises air. Additionally or alternatively to one or more of the examples above, in some examples, the method further includes the steps of bringing an inert barrier gas onto the top surface through at least one barrier gas inlet channel integrated with the nozzle assembly, and collecting a waste gas and the inert barrier gas into an at least one integrated exhaust channel in the nozzle assembly, wherein the waste gas is generated during the step of thinning down and the at least one barrier gas inlet channel and the at least one integrated exhaust channel are configured to isolate the test region from the enclosure environment. Additionally or alternatively to one or more of the examples above, in some examples, the film is a semiconductor film. Additionally or alternatively to one or more of the examples above, in some examples, the etchant gas comprises a halogen. Additionally or alternatively to one or more of the examples above, in some examples, supplying the etchant gas comprises flowing the etchant gas from a pressure bottle to the nozzle wherein a pressure of the etchant gas in the pressure bottle is above atmospheric pressure. Additionally or alternatively to one or more of the examples above, in some examples, the pressure of the etchant gas in the pressure bottle is above 2000 Torrs.

Some examples of the disclosure are directed to a method of obtaining a depth profile of an electrical property through a semiconductor layer, the method comprising the steps of: providing a test pattern of the semiconductor layer, the test pattern having a top surface and contact areas at the top surface, depositing a resist spacer over the test pattern excluding the contact areas, the resist spacer having a top side and a window exposing a test region of the test pattern, making two or more electrical contacts to the top surface of the test pattern at the contact areas, measuring the electrical property of the semiconductor layer at the test region using the two or more electrical contacts, exposing the test region to a chemical, rendering a top portion of the semiconductor layer at the test region electrically inactive by using the chemical, determining the electrical property of a remaining portion of the semiconductor layer at the test region, other than the top portion of semiconductor layer at the test region, using the two or more electrical contacts. Additionally or alternatively to one or more of the examples above, in some examples, the chemical is an anodic oxidation solution and rendering the top portion of the semiconductor layer at the test region electrically inactive comprises oxidation of the top portion of the semiconductor layer at the test region by applying an anodic voltage to the test pattern with respect to an anode touching the anodic oxidation solution. Additionally or alternatively to one or more of the examples above, in some examples, the chemical is a chemical etchant solution and rendering the top portion of the semiconductor layer at the test region electrically inactive comprises chemically etching the top portion of the semiconductor layer at the test region with the chemical etchant solution. Additionally or alternatively to one or more of the examples above, in some examples, the chemical is a process solution and rendering the top portion of the semiconductor layer at the test region electrically inactive comprises dissolution of the top portion of the semiconductor layer at the test region by applying a voltage to the test pattern with respect to an electrode touching the process solution. Additionally or alternatively to one or more of the examples above, in some examples, the voltage is an anodic voltage. Additionally or alternatively to one or more of the examples above, in some examples, the process solution is configured not to chemically etch the semiconductor layer at the test region in absence of the voltage. Additionally or alternatively to one or more of the examples above, in some examples, the chemical is a process gas and rendering the top portion of the semiconductor layer at the test region electrically inactive comprises chemically etching the top portion of the semiconductor layer at the test region with the process gas. Additionally or alternatively to one or more of the examples above, in some examples, the method further comprises the step of disposing an open end of a process chamber over the test region forming a process cavity, wherein the open end of the process chamber comprises a seal at its circumference sealing the process cavity, wherein the contact areas are left outside the process cavity, wherein the test region is fully exposed to the process cavity, and wherein exposing the test region to the chemical comprises introducing the chemical into the process cavity. Additionally or alternatively to one or more of the examples above, in some examples, the method further comprises the step of disposing an open end of a process chamber over the test region forming a process cavity, wherein the open end of the process chamber comprises a seal at its circumference sealing the process cavity, wherein the contact areas are left outside the process cavity, wherein the test region is fully exposed to the process cavity, and wherein exposing the test region to the chemical comprises introducing the chemical into the process cavity. Additionally or alternatively to one or more of the examples above, in some examples, the method further comprises the step of disposing an open end of a process chamber over the test region forming a process cavity, wherein the open end of the process chamber comprises a seal at its circumference sealing the process cavity, wherein the contact areas are left outside the process cavity, wherein the test region is fully exposed to the process cavity, and wherein exposing the test region to the chemical comprises introducing the chemical into the process cavity. Additionally or alternatively to one or more of the examples above, in some examples, the method further comprises the step of monitoring a distance between the top side of the resist spacer and a surface of the remaining portion of the semiconductor layer at the test region thus determining a rate of chemical etching. Additionally or alternatively to one or more of the examples above, in some examples, the monitoring is carried out using an optical detector.

Although the foregoing description has shown, illustrated and described various embodiments of the present invention, it will be apparent that various substitutions, modifications and changes to the embodiments described may be made by those skilled in the art without departing from the spirit and scope of the present inventions.

We claim:

1. A method of obtaining a depth profile of an electrical property through a semiconductor layer, which is in the form of a test pattern, the semiconductor layer comprising a top surface and the test pattern comprising a test region and contact regions, the method comprising the steps of:
    placing the semiconductor layer in a containment chamber,
    measuring the electrical property of the semiconductor layer at the test region,
    delivering a process gas onto the top surface of the semiconductor layer only at the test region,
    chemically etching a predetermined thickness of the semiconductor layer only at the test region using the process gas to form a trench with a depth in the semiconductor layer at the test region and leaving behind a remaining portion of the semiconductor layer at the test region, and
    measuring the electrical property of the remaining portion of the semiconductor layer at the test region,
    wherein the electrical property is at least one of sheet resistance, resistivity, mobility, and carrier concentration,
    wherein contact regions are outside the test region and the steps of measuring the electrical property of the semiconductor layer at the test region and measuring the electrical property of the remaining portion of the semiconductor layer at the test region comprise electrically contacting the test pattern at the contact regions, and
    wherein the containment chamber is at atmospheric pressure.

2. The method of claim 1, wherein the steps of chemically etching the predetermined thickness of the semiconductor layer only at the test region, and measuring the electrical property of the remaining portion of the semiconductor layer are repeated until the depth of the trench reaches a final value.

3. The method of claim 2, wherein the step of chemically etching is carried out at a predetermined etching rate of less than 5 nm/second.

4. The method of claim 2, wherein the final value of the trench depth is less than 50 nm.

5. The method of claim 1, wherein the electrical property is mobility, and a magnetic field substantially perpendicular to the top surface is applied to the test region during the steps of measuring the electrical property of the semiconductor layer at the test region and measuring the electrical property of the remaining portion of the semiconductor layer at the test region.

6. The method of claim 1, wherein the step of delivering the process gas onto the top surface only at the test region comprises:
    providing a process chamber within the containment chamber, the process chamber comprising one or more walls and an open end,
    bringing the process chamber into physical contact with the top surface so that the open end seals against the top surface forming a confined process space surrounded by the one or more walls of the process chamber exposing the test region but not the contact regions to the confined process space, and
    introducing the process gas into the confined process space and establishing a process pressure.

7. The method of claim 6, wherein the process pressure is atmospheric pressure.

8. The method of claim 7, wherein the process gas comprises an etching agent comprising a halogen.

9. The method of claim 8, wherein the etching agent is $XeF_2$.

10. The method of claim 8, wherein a percentage of the etching agent in the process gas is less than 0.1%.

11. The method of claim 1, wherein an area of the test region is smaller than 0.04 $cm^2$.

12. An apparatus for obtaining a depth profile of an electrical property through a semiconductor layer, the semiconductor layer comprising a top surface, a test region, and two or more contact regions that are outside the test region, the apparatus comprising:
    a containment chamber at atmospheric pressure configured to enclose the semiconductor layer, at least one inlet configured to deliver a process gas onto the top surface of the semiconductor layer only at the test region, the process gas configured to chemically etch a predetermined thickness of the semiconductor layer at the test region to form a trench with a depth in the semiconductor layer at the test region, leaving behind a remaining portion of the semiconductor layer at the test region, and a measurement system configured to measure the electrical property of the semiconductor layer at the test region using electrical contacts made to the two or more contact regions, wherein the electrical property is at least one of sheet resistance, resistivity, mobility, and carrier concentration.

13. The apparatus of claim 12, wherein chemically etching the predetermined thickness of the semiconductor layer only at the test region, and measurement of the electrical property of the remaining portion of the semiconductor layer are repeated until the depth of the trench reaches a final value.

14. The apparatus of claim 12, further comprising a magnet configured to apply a magnetic field substantially perpendicular to the top surface of the semiconductor layer at the test region for mobility measurement.

15. The apparatus of claim 12, further comprising a process chamber within the containment chamber, the process chamber comprising one or more walls and an open end, wherein delivery of the process gas onto the top surface at the test region comprises:

bringing the process chamber into physical contact with the top surface so that the open end seals against the top surface forming a confined process space surrounded by the one or more walls of the process chamber exposing the test region but not the two or more contact regions to the confined process space, and introducing the process gas into the confined process space and establishing a process pressure.

16. The apparatus of claim 15, wherein the process pressure is atmospheric pressure.

17. The apparatus of claim 16, wherein the process gas comprises an etching agent comprising a halogen.

18. The apparatus of claim 12, wherein an area of the test region is smaller than 0.04 $cm^2$.

* * * * *